(12) United States Patent
Cairns

(10) Patent No.: US 9,697,177 B1
(45) Date of Patent: Jul. 4, 2017

(54) ANALYTIC SYSTEM FOR SELECTING A DECOMPOSITION DESCRIPTION OF SENSOR DATA

(71) Applicant: SAS Institute Inc., Cary, NC (US)

(72) Inventor: Douglas Allan Cairns, Durham, NC (US)

(73) Assignee: SAS Institute Inc., Cary, NC (US)

( * ) Notice: Subject to any disclaimer, the term of this patent is extended or adjusted under 35 U.S.C. 154(b) by 0 days.

(21) Appl. No.: 15/390,164

(22) Filed: Dec. 23, 2016

Related U.S. Application Data

(60) Provisional application No. 62/407,823, filed on Oct. 13, 2016, provisional application No. 62/409,849, filed on Oct. 18, 2016.

(51) Int. Cl.
| | | |
|---|---|---|
| *G06F 7/00* | (2006.01) | |
| *G06F 17/16* | (2006.01) | |
| *H03M 7/30* | (2006.01) | |
| *G06F 17/17* | (2006.01) | |

(52) U.S. Cl.
CPC ............ *G06F 17/16* (2013.01); *G06F 17/175* (2013.01); *H03M 7/30* (2013.01)

(58) Field of Classification Search
CPC ......... G06F 17/16; G06F 17/175; H03M 7/30
USPC ........................................................ 708/203
See application file for complete search history.

(56) References Cited

U.S. PATENT DOCUMENTS

| | | | |
|---|---|---|---|
| 6,704,692 B1 * | 3/2004 | Banerjee ............... | G01S 13/726 342/96 |
| 6,807,536 B2 | 10/2004 | Achlioptas et al. | |
| 8,126,648 B2 | 2/2012 | Saltzer et al. | |
| 8,306,361 B2 | 11/2012 | Nakamura et al. | |
| 2009/0216821 A1 | 8/2009 | Nakamura et al. | |
| 2009/0265404 A1 * | 10/2009 | Tzeng ..................... | G06F 17/16 708/208 |
| 2013/0013659 A1 | 1/2013 | Kankar et al. | |
| 2014/0372495 A1 | 12/2014 | Sun et al. | |

(Continued)

OTHER PUBLICATIONS

Woolfe et al., A fast randomized algorithm for the approximation of matrices, Appl. Comput. Harmon. Anal. 25, Dec. 23, 2007, pp. 335-366.

(Continued)

*Primary Examiner* — Tan V. Mai

(74) *Attorney, Agent, or Firm* — Bell & Manning, LLC

(57) ABSTRACT

A computing device determines upper and lower bounds of a largest singular value for an approximate decomposition of a dataset. An approximate decomposition is computed using either a principal components or a singular value decomposition algorithm. A lower bound of a largest singular value is computed for the computed approximate decomposition using a first linear approximation to a function of a singular value ratio. A first set of coefficients for a second linear approximation to an error function is computed for the function of the singular value ratio using the computed approximate decomposition. A second set of coefficients for a third linear approximation is computed using the computed first set of coefficients. An upper bound of the largest singular value is computed using the computed second set of coefficients. The upper bound and the lower bound are output to provide an estimate of a quality of the decomposition.

30 Claims, 16 Drawing Sheets

(56) References Cited

U.S. PATENT DOCUMENTS

2015/0177030 A1* 6/2015 Vilim ............... G06K 9/00563
702/183
2016/0055124 A1 2/2016 Galvin et al.

OTHER PUBLICATIONS

SAS Institute Inc. 2016. SAS® Visual Data Mining and Machine Learning 8.1: Data Mining and Machine Learning Procedures. Cary, NC: SAS Institute Inc., Sep. 2016.
SAS Institute Inc. 2016. SAS® Visual Data Mining and Machine Learning 8.1: Statistical Procedures. Cary, NC: SAS Institute Inc., Sep. 2016.
Mahoney et al., CUR matrix decompositions for improved data analysis, PNAS, vol. 106, No. 3, Jan. 20, 2009, pp. 697-702.
Kang et al., Improving the Recovery of Principal Components with Semi-Deterministic Random Projections, 2016 Annual Conference on Information Science and Systems (CISS), Mar. 16, 2016.
Magen et al., Low Rank Matrix-valued Chernoff Bounds and Approximate Matrix Multiplication, May 2010.
SAS Institute Inc. 2015. SAS/STAT® 14.1 User's Guide. Cary, NC: SAS Institute Inc., Jul. 2015.
SAS Institute Inc. 2011. SAS/STAT® 9.3 User's Guide. Cary, NC: SAS Institute Inc., Jul. 2011.
M. Mahoney, Randomized algorithms for matrices and data, arXiv:1104.5557v3, Version appearing as a monograph in Now Publishers' "Foundations and Trends in Machine Learning" series, Nov. 15, 2011.
Halko et al., Finding Structure with Randomness: Probabilistic Algorithms for Constructing Approximate Matrix Decompositions, SIAM Rev., Survey and Review section, vol. 53, No. 2, arXiv:0909.4061v2, Jun. 2011, pp. 217-288.
Rokhlin et al., A Randomized Algorithm for Principal Component Analysis, arXiv:0809.2274v4, SIAM Journal on Matrix Analysis and Applications, 31 (3), 2009, pp. 1100-1124.
N. Halko, Randomized methods for computing low-rank approximations of matrices, 2012.
Liberty et al., Randomized algorithms for the low-rank approximation of matrices, PNAS, vol. 104, No. 51, Dec. 18, 2007, pp. 20167-20172.
Drineas et al., Relative-Error $CUR$ Matrix Decompositions, SIAM Journal on Matrix Analysis and Applications 30:2, 2008, pp. 844-881.
J. Tropp, User-Friendly Tail Bounds for Sums of Random Matrices, Found Comput Math 12, Aug. 2, 2011, pp. 389-434.
Kambatla et al., Trends in big data analytics, Journal of Parallel and Distributed Computing, vol. 74, Issue 7, Feb. 2, 2014, pp. 2561-2573.

* cited by examiner

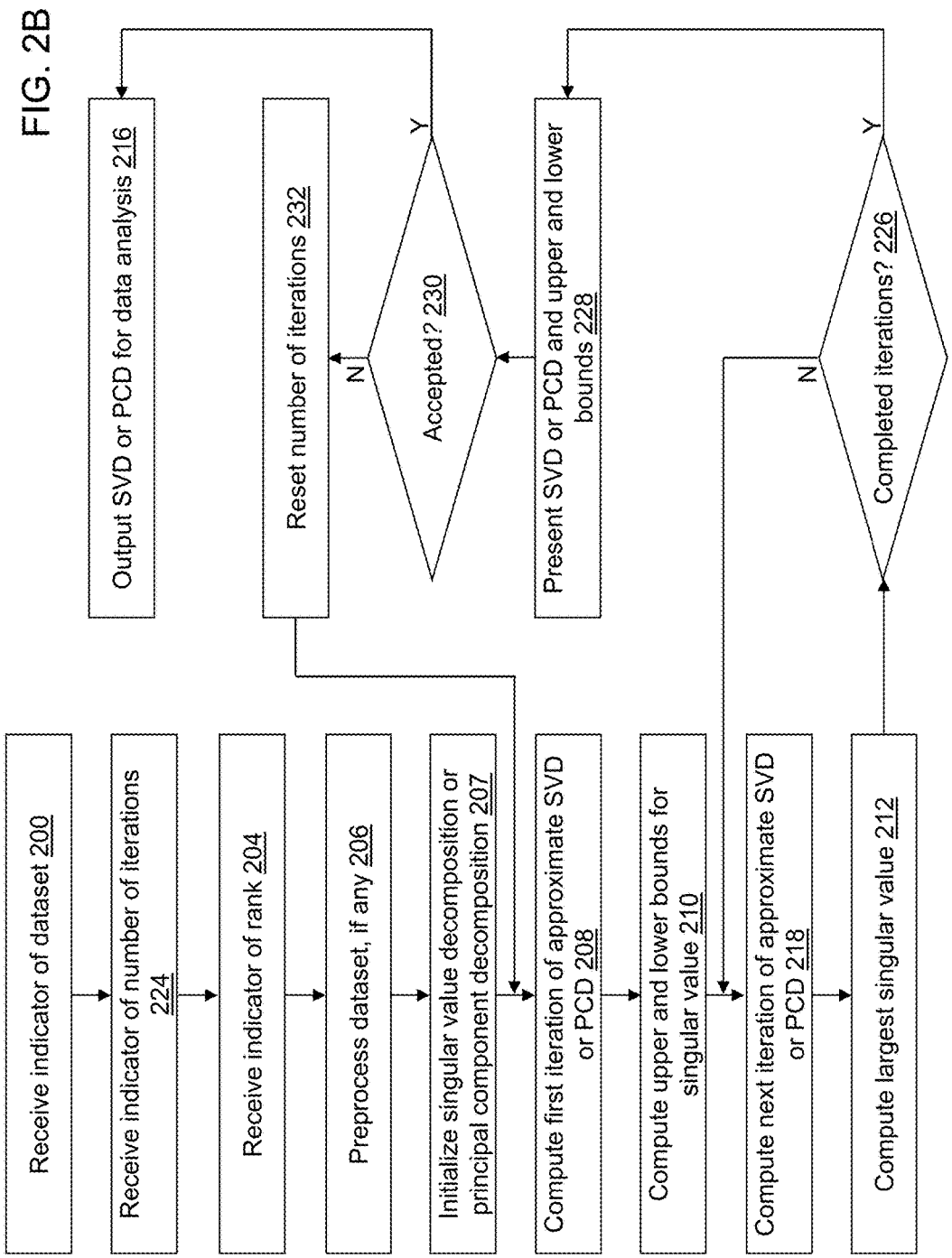

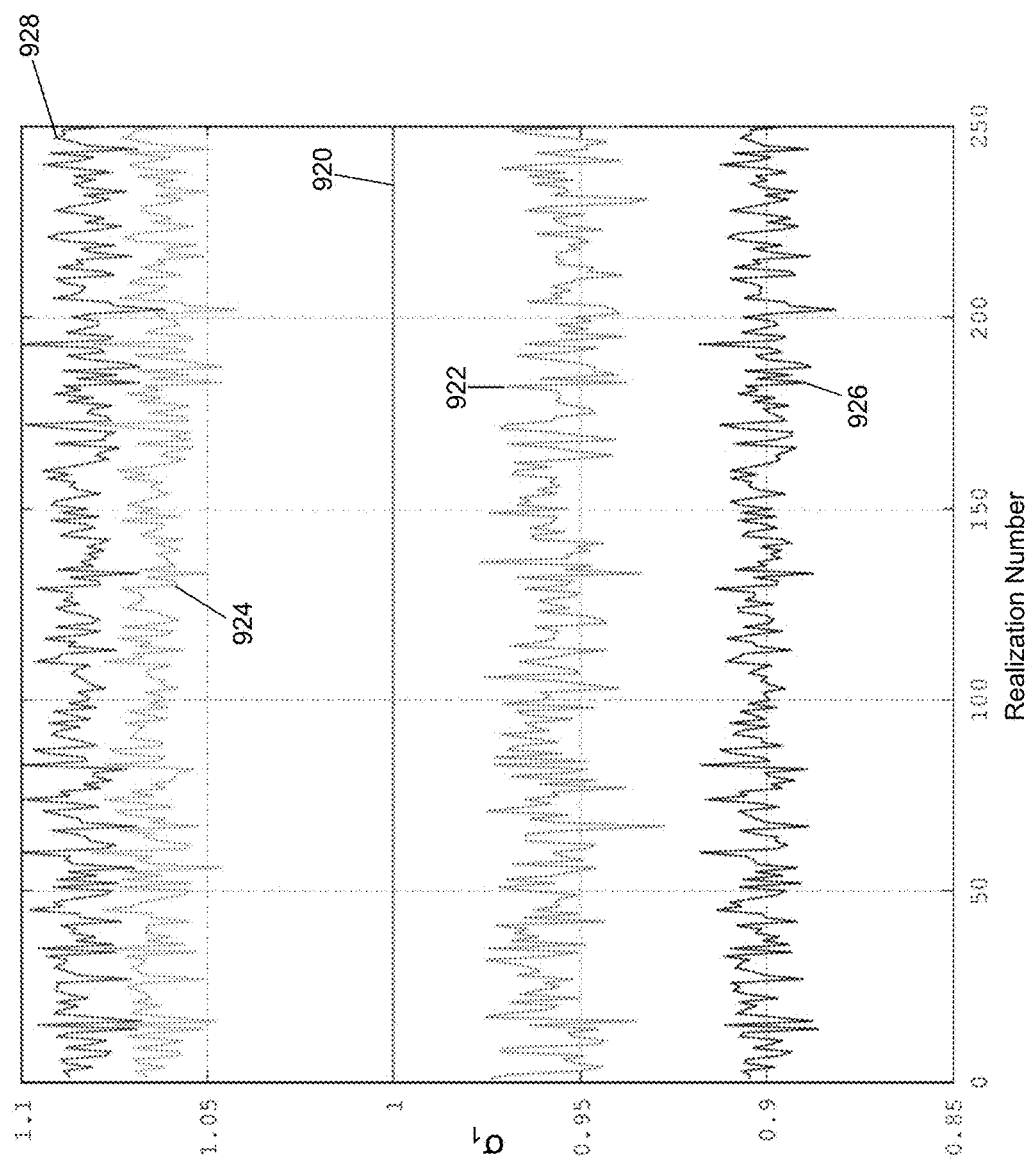

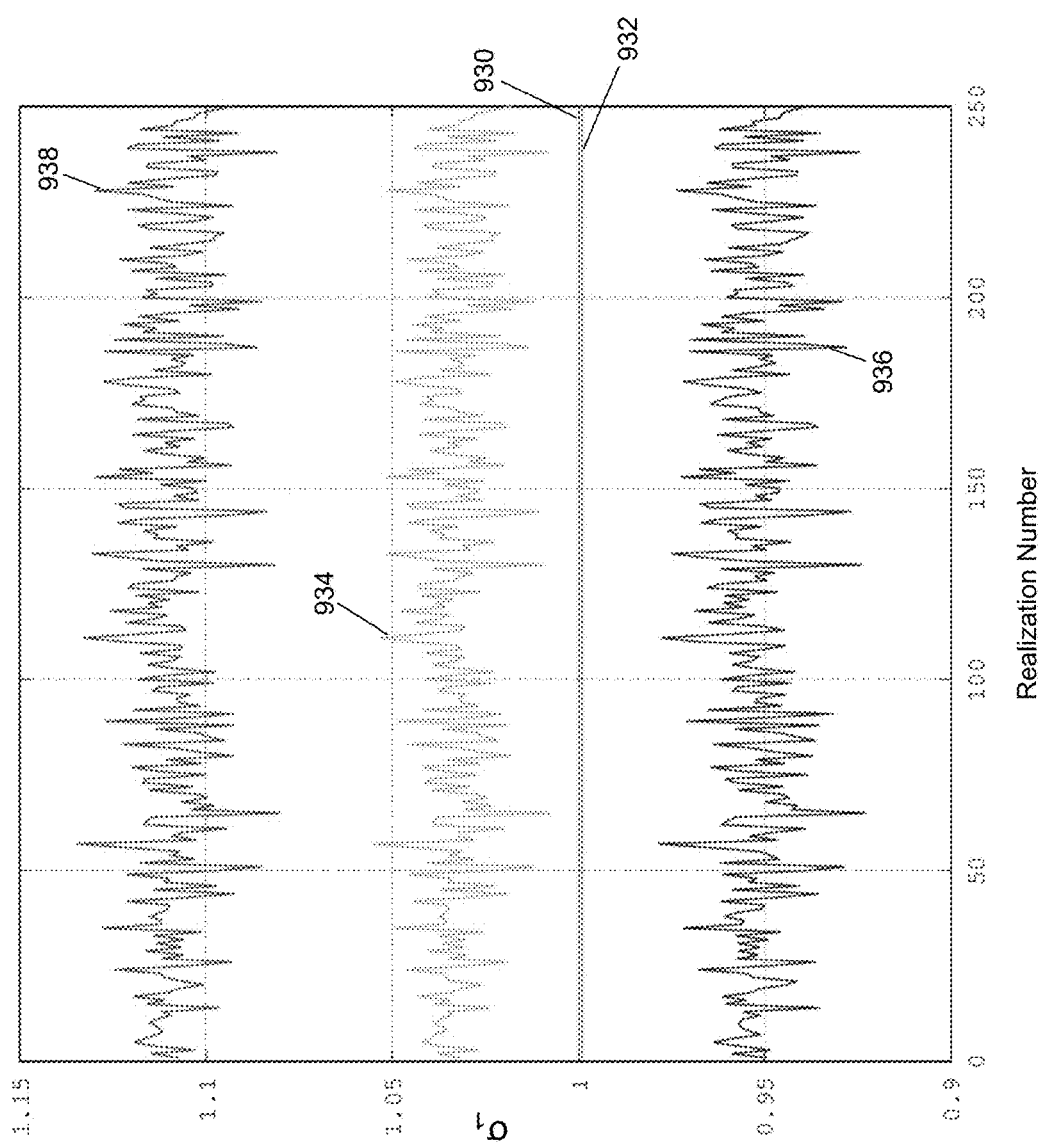

US 9,697,177 B1

ANALYTIC SYSTEM FOR SELECTING A DECOMPOSITION DESCRIPTION OF SENSOR DATA

CROSS-REFERENCE TO RELATED APPLICATIONS

The present application claims the benefit of 35 U.S.C. §119(e) to U.S. Provisional Patent Application No. 62/407,823 filed on Oct. 13, 2016, and to U.S. Provisional Patent Application No. 62/409,849 filed on Oct. 18, 2016, the entire contents of which are hereby incorporated by reference.

BACKGROUND

Randomized techniques for approximating matrix decompositions may be used when a dataset is too large to efficiently solve a direct matrix decomposition. For example, the dataset may have too many observations (i.e., rows) and/or variables (i.e., columns) to solve using traditional techniques due to the amount of time or memory required to compute a solution. Two illustrative examples are the singular value decomposition (SVD) and a matrix decomposition that is inherent in a principal components analysis (hereafter denoted the principal components decomposition (PCD)). Of course, a drawback to using a decomposition based on randomization is that the resulting matrix factors are an approximation to the true matrix factors.

SUMMARY

In an example embodiment, a non-transitory computer-readable medium is provided having stored thereon computer-readable instructions that, when executed by a computing device, cause the computing device to determine upper and lower bounds of a largest singular value for an approximate decomposition of a dataset. An approximate decomposition is computed using either a principal components or a singular value decomposition algorithm. A lower bound of a largest singular value is computed for the computed approximate decomposition using a first linear approximation to a function of a singular value ratio. A first set of coefficients for a second linear approximation to an error function is computed for the function of the singular value ratio using the computed approximate decomposition. A second set of coefficients for a third linear approximation is computed using the computed first set of coefficients. An upper bound of the largest singular value is computed using the computed second set of coefficients. The upper bound and the lower bound are output to provide an estimate of a quality of the decomposition.

In another example embodiment, a computing device is provided. The system includes, but is not limited to, a processor and a non-transitory computer-readable medium operably coupled to the processor. The computer-readable medium has instructions stored thereon that, when executed by the computing device, cause the computing device to determine upper and lower bounds of a largest singular value for an approximate decomposition of a dataset.

In yet another example embodiment, a method of determine upper and lower bounds of a largest singular value for an approximate decomposition of a dataset is provided.

Other principal features of the disclosed subject matter will become apparent to those skilled in the art upon review of the following drawings, the detailed description, and the appended claims.

BRIEF DESCRIPTION OF THE DRAWINGS

Illustrative embodiments of the disclosed subject matter will hereafter be described referring to the accompanying drawings, wherein like numerals denote like elements.

FIGS. 2A, 2B, 3, 4, 5, 6A, and 6B depict a flow diagram illustrating examples of operations performed by the decomposition description device of FIG. 1 in accordance with an illustrative embodiment.

FIG. 9C depicts upper and lower bound values computed by the decomposition description device of FIG. 1 using a rank value of 200 and a single iteration in accordance with illustrative embodiments.

FIG. 9D depicts upper and lower bound values computed by the decomposition description device of FIG. 1 using a rank value of 5 and ten iterations in accordance with illustrative embodiments.

DETAILED DESCRIPTION

Figure 1:
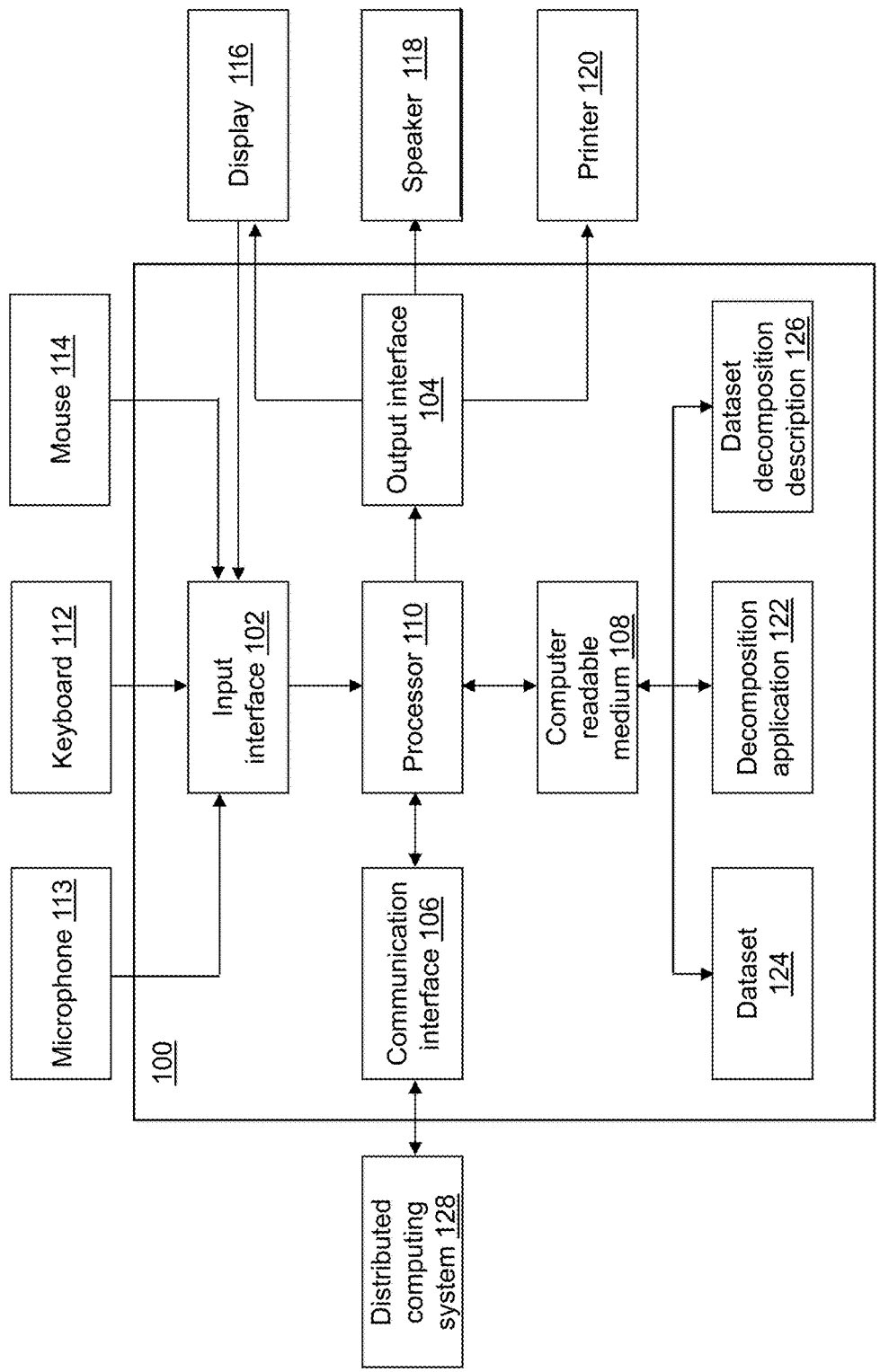
FIG. 1 depicts a block diagram of a decomposition description device in accordance with an illustrative embodiment.

In data science, engineering, and statistical applications, data often consists of multiple measurements (across sensors, characteristics, responses, etc.) collected across multiple time instances (patients, test subjects, etc.). These measurements are collected in a dataset for analysis and processing. While the dimension of the measurements may be p (e.g. the number of sensors), the underlying process that generated the measurements may be of a lower dimension k. For analysis/processing, the data is typically represented as a matrix X. Here the rows represent observations (time instances, patients, etc.) and columns represent measurements (sensors, characteristics, etc.). The analysis/processing of X often begins by creating a reduced rank approximation $X_k$. There are a number of ways to compute such a reduced rank approximation. Two popular related techniques include the singular value decomposition (SVD) and principal components analysis (PCA) referred to herein as a principal components decomposition (PCD).

Mathematically, a singular value decomposition (SVD) is written as $X=U\Sigma V^T$, where X is an input dataset expressed as a matrix, U is an orthonormal matrix of left singular vectors, $\Sigma$ is a diagonal matrix of singular values, and V is an orthonormal matrix of right singular vectors. Mathematically, a principal component decomposition (PCD) is written as T=XW, where T is a principal components score matrix, and W is a matrix whose columns are the eigenvectors of $X^T X$.

In the big data era, classical techniques for computing either decomposition, SVD or PCD, fail completely or take an inordinate amount of time. However, randomized versions of the SVD and PCD have emerged that make the computations tractable for massive datasets. These randomized algorithms are typically iterative, and provide approximate decompositions. The quality of the decomposition is a function of the number of iterations, so some means of terminating the iterative process is necessary. Bounding a largest singular value $\sigma_1$ of X ($\sigma_1$) using intermediate quantities computed during the randomized decomposition may be used in conjunction with a largest estimated singular value $\tilde{\sigma}_1$ to either terminate the iterative process or assess the quality of the estimated decomposition.

The approximate SVD may be defined as $$X_k \approx \tilde{U}\tilde{\Sigma}_k \tilde{V}^T \quad (1)$$

where $X_k$ is the rank k approximation to X, $\tilde{U}$ is an approximation of the orthonormal matrix of left singular vectors, $\tilde{\Sigma}_k$ is an approximation of the diagonal matrix of singular values, and $\tilde{V}^T$ is an approximation of the orthonormal matrix of right singular vectors. The approximate left/right singular vectors can be written in terms of the true left/right singular vectors using $$\tilde{u}_j = \sum_{i=1}^{n} b_{ji} u_i \quad (2)$$

$$\tilde{v}_j = \sum_{i=1}^{n} a_{ji} v_i.$$

Three intermediate quantities needed for computation of the upper/lower bound of the largest singular value are $$Z_1 = \sum_{j=1}^{k} \tilde{u}_j X \tilde{v}_j^T \quad (3)$$

$$Z_2 = \sum_{j=1}^{k} \|X \tilde{v}_j^T\|_2^2$$

$$Z_3 = \sum_{j=1}^{k} \|X^T X \tilde{v}_j^T\|_2^2.$$

Using linear algebra, the three intermediate quantities are (approximately) equivalent to $$Z_1 \approx \sigma_1 \sum_{i=1}^{n} \sqrt[4]{\beta_i}\, \alpha_i \quad (4)$$

$$Z_2 = \sigma_1^2 \sum_{i=1}^{n} \sqrt{\beta_i}\, \alpha_i$$

$$Z_3 = \sigma_1^4 \sum_{i=1}^{n} \beta_i \alpha_i$$

where $$\beta_i = \frac{\sigma_i^4}{\sigma_1^4} \quad (5)$$

$$\alpha_i = \sum_{j=1}^{k} a_{ij}^2.$$

The estimation of $\sigma_1$ may be solved as a least squares problem. $\beta$ may be referred to as a singular value ratio vector where $\beta_i$ is a singular value ratio for a singular value $\sigma_i$. To manipulate the equations for $Z_1$, $Z_2$ and $Z_3$ into a form amenable for least squares solution, two linear approximations may be computed: 1) a first linear approximation to a function of and 2) a second linear approximation of an error incurred as a result of the first linear approximation. The second linear approximation may be referred to as a singular value ratio error adjustment or an error function computed for the function of $\beta$. For the first linear approximation, $\beta_i^{1/4}$ and $\beta_i^{1/2}$ may be linearly approximated as $$\beta_i^{1/4} \approx \rho_1 \beta_i + \gamma_1$$

$$\beta_i^{1/2} \approx \rho_2 \beta_i + \gamma_2 \quad (6)$$

where $\rho_1$, $\gamma_1$, $\rho_2$, and $\gamma_2$ form a first set of coefficients for a first linear approximation to the singular value ratio using either SVD or PCD. As discussed further below different functions of $\beta$ may be used such as $$\beta_i = \frac{\sigma_i}{\sigma_1} \text{ or } \beta_i = \frac{\sigma_i^2}{\sigma_1^2}.$$

Figure 7:
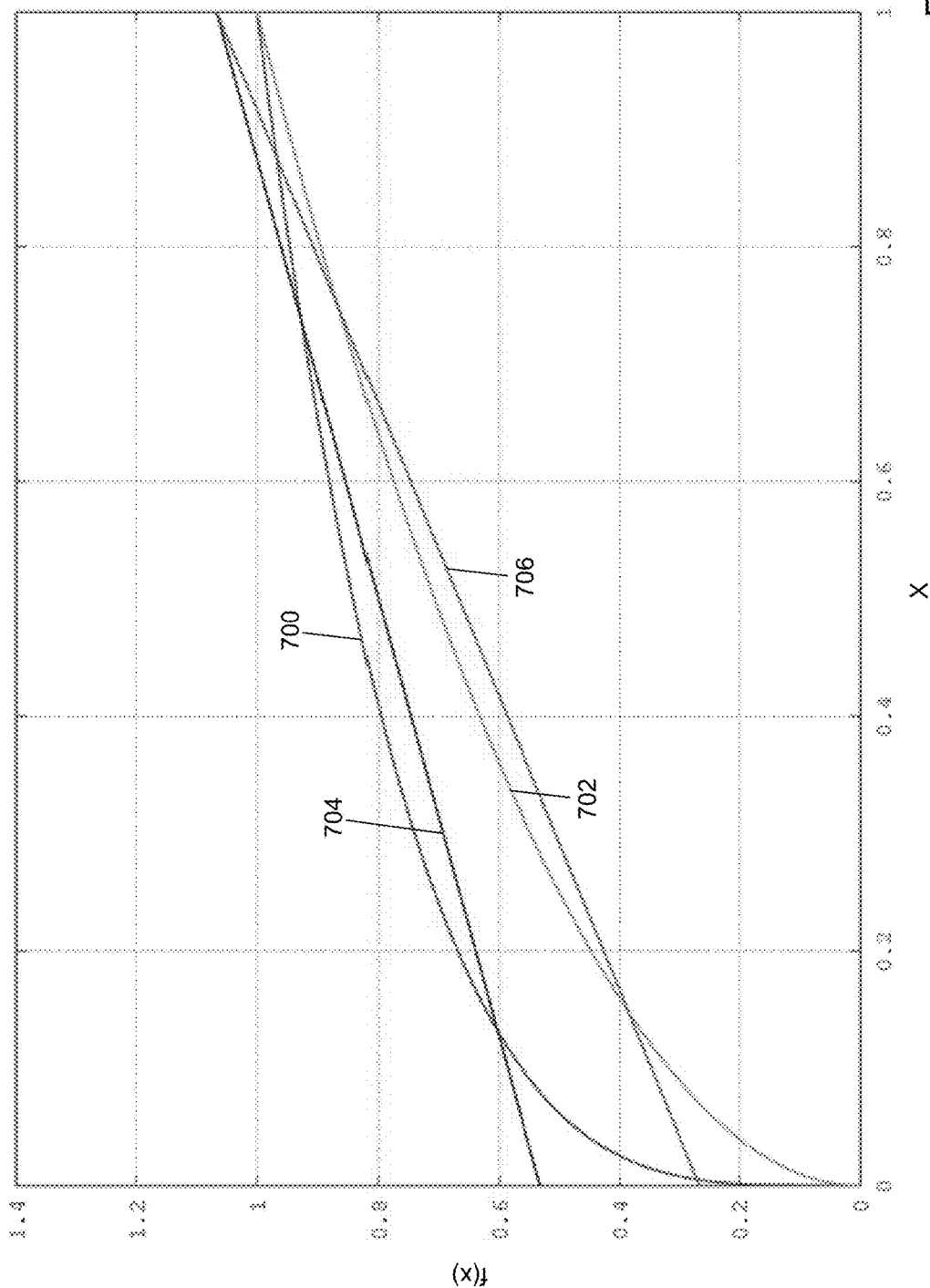
FIG. 7 depicts a first linear approximation in accordance with an illustrative embodiment.

While these may not be good approximations for all values of $\beta_i$, by definition $0 < \beta_i \leq 1$, so the approximation need only hold in this range. Referring to FIG. 7, an error that may result from the linear approximation is illustrated. A first curve 700 shows $f(x)=x^{0.25}$. A second curve 702 shows $f(x)=x^{0.5}$. A third curve 704 shows $f(x)=\rho_1+\gamma_1 x$. A fourth curve 706 shows $f(x)=\rho_2+\gamma_2 x$. A difference between third curve 704 and first curve 700 represents an error in the linear approximation for $\beta_i^{1/4}$. A difference between fourth curve 706 and second curve 702 represents an error in the linear approximation for $\beta_i^{1/2}$.

Using the first linear approximation for $\beta_i^{1/4}$ and $\beta_i^{1/2}$ the equations for the intermediate quantities can be rewritten and simplified to the following form:

$$Z_1 \approx \sigma_1 \left[ \sum_{i=1}^{n} \beta_i \alpha_i \left( \rho_1 + \frac{\gamma_1 k}{\sum_{i=1}^{n} \beta_i \alpha_i} \right) \right] \quad (7)$$

$$Z_2 = \sigma_1^2 \left[ \sum_{i=1}^{n} \beta_i \alpha_i \left( \rho_2 + \frac{\gamma_2 k}{\sum_{i=1}^{n} \beta_i \alpha_i} \right) \right]$$

-continued $$Z_3 = \sigma_1^4 \sum_{i=1}^{n} \beta_i \alpha_i.$$

Taking logarithms results in:

$$\log(Z_1) \approx \log(\sigma_1) + \log\left(\sum_{i=1}^{n} \beta_i \alpha_i\right) + \log\left(\rho_1 + \frac{\gamma_1 k}{\sum_{i=1}^{n} \beta_i \alpha_i}\right) \quad (8)$$

$$\log(Z_2) = 2\log(\sigma_1) + \log\left(\sum_{i=1}^{n} \beta_i \alpha_i\right) + \log\left(\rho_2 + \frac{\gamma_2 k}{\sum_{i=1}^{n} \beta_i \alpha_i}\right)$$

$$\log(Z_3) = 4\log(\sigma_1) + \log\left(\sum_{i=1}^{n} \beta_i \alpha_i\right).$$

A second linear approximation places equation (8) into a proper form for a least squares solution. Note that a plot of $$\log\left(\sum_{i=1}^{n} \beta_i \alpha_i\right)$$

versus $$\log\left(\rho_j + \frac{\gamma_j k}{\sum_{i=1}^{n} \beta_i \alpha_i}\right)$$

could be approximated by a piecewise linear function. The key is to ensure that an actual range of $$\log\left(\sum_{i=1}^{n} \beta_i \alpha_i\right)$$

for the given data corresponds with a single piecewise linear region. Since $$\frac{k}{\sum_{i=1}^{n} \beta_i \alpha_i} \geq 1,$$

and $$\frac{k}{\sum_{i=1}^{n} \beta_i \alpha_i} \leq L,$$

the following second linear approximation is reasonable $$\log\left(\rho_1 + \frac{\gamma_1 k}{\sum_{i=1}^{n} \beta_i \alpha_i}\right) \approx \delta_1 \log\left(\sum_{i=1}^{n} \beta_i \alpha_i\right) + \lambda_1 \quad (9)$$

-continued $$\log\left(\rho_2 + \frac{\gamma_2 k}{\sum_{i=1}^{n} \beta_i \alpha_i}\right) \approx \delta_2 \log\left(\sum_{i=1}^{n} \beta_i \alpha_i\right) + \lambda_2.$$

where $\delta_1$, $\lambda_1$, $\delta_2$, and $\lambda_2$ form a second set of coefficients for a second linear approximation using either SVD or PCD. L is an upper limit on the piecewise linear region that is being approximated. L can be defined as an input parameter. For illustration, L=3 has been used, though other choices are also valid.

Figure 8:
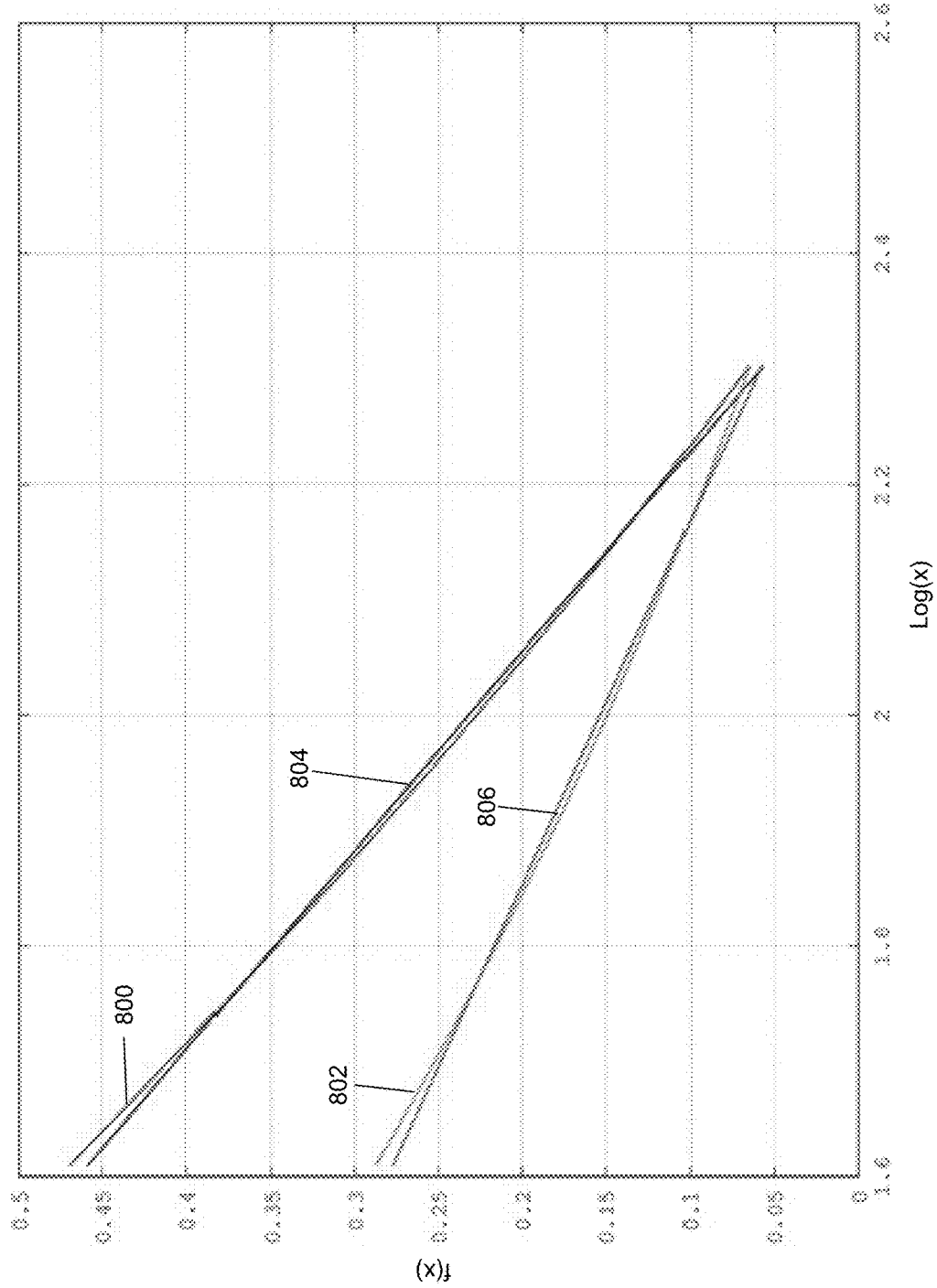
FIG. 8 depicts a second linear approximation in accordance with an illustrative embodiment.

For example, referring to FIG. 8, an error that results from the second linear approximation is illustrated. A first curve 800 shows $f(x)=\rho_1+\gamma_1 k/x$. A second curve 802 shows $f(x)=\rho_2+\gamma_2 k/x$. A third curve 804 shows $f(x)=\delta_1 \log(x)+\lambda_1$. A fourth curve 806 shows $f(x)=\delta_2 \log(x)+\lambda_2$. A difference between third curve 804 and first curve 800 represents an error for a first portion of equation (9). A difference between fourth curve 806 and second curve 802 represents an error for a second portion of equation (9).

Using the linear approximations, a final set of linear equations can be written as $$\log(Z_1) - \lambda_1 \approx \log(\sigma_1) + (1+\delta_1)\log\left(\sum_{i=1}^{n} \beta_i \alpha_i\right) \quad (10)$$

$$\log(Z_2) - \lambda_2 = 2\log(\sigma_1) + (1+\delta_2)\log\left(\sum_{i=1}^{n} \beta_i \alpha_i\right)$$

$$\log(Z_3) = 4\log(\sigma_1) + \log\left(\sum_{i=1}^{n} \beta_i \alpha_i\right).$$

The least squares solution to equation (10) is $$\begin{bmatrix} \log(\sigma_1) \\ \log\left(\sum_{i=1}^{n} \beta_i \alpha_i\right) \end{bmatrix} \approx (A^T A)^{-1} A^T b \quad (11)$$

where $$A = \begin{bmatrix} 1 & 1+\delta_1 \\ 2 & 1+\delta_2 \\ 4 & 1 \end{bmatrix} \quad (12)$$

$$b = \begin{bmatrix} \log(Z_1) - \lambda_1 \\ \log(Z_2) - \lambda_2 \\ \log(Z_3) \end{bmatrix}.$$

Taking an inverse logarithm of the least squares solution provides estimates for $\sigma_1$, the largest singular value, and $$\sum_{i=1}^{n} \beta_i \alpha_i.$$

Referring to FIG. 1, a block diagram of a decomposition description device 100 is shown in accordance with an illustrative embodiment. Decomposition description device 100 may compute upper and lower bounds for $\sigma_1$ using first and second linear approximations, for example, as described above. Decomposition description device 100 may include an input interface 102, an output interface 104, a communication interface 106, a non-transitory computer-readable medium 108, a processor 110, a decomposition application 122, a dataset 124, and a dataset decomposition description 126. Fewer, different, and/or additional components may be incorporated into decomposition description device 100.

Input interface 102 provides an interface for receiving information from the user or another device for entry into decomposition description device 100 as understood by those skilled in the art. Input interface 102 may interface with various input technologies including, but not limited to, a keyboard 112, a microphone 113, a mouse 114, a display 116, a track ball, a keypad, one or more buttons, etc. to allow the user to enter information into decomposition description device 100 or to make selections presented in a user interface displayed on display 116. The same interface may support both input interface 102 and output interface 104. For example, display 116 comprising a touch screen provides a mechanism for user input and for presentation of output to the user. Decomposition description device 100 may have one or more input interfaces that use the same or a different input interface technology. The input interface technology further may be accessible by decomposition description device 100 through communication interface 106.

Output interface 104 provides an interface for outputting information for review by a user of decomposition description device 100 and/or for use by another application or device. For example, output interface 104 may interface with various output technologies including, but not limited to, display 116, a speaker 118, a printer 120, etc. Decomposition description device 100 may have one or more output interfaces that use the same or a different output interface technology. The output interface technology further may be accessible by decomposition description device 100 through communication interface 106.

Communication interface 106 provides an interface for receiving and transmitting data between devices using various protocols, transmission technologies, and media as understood by those skilled in the art. Communication interface 106 may support communication using various transmission media that may be wired and/or wireless. Decomposition description device 100 may have one or more communication interfaces that use the same or a different communication interface technology. For example, decomposition description device 100 may support communication using an Ethernet port, a Bluetooth antenna, a telephone jack, a USB port, etc. Data and messages may be transferred between decomposition description device 100 and another computing device of a distributed computing system 128 using communication interface 106.

Computer-readable medium 108 is an electronic holding place or storage for information so the information can be accessed by processor 110 as understood by those skilled in the art. Computer-readable medium 108 can include, but is not limited to, any type of random access memory (RAM), any type of read only memory (ROM), any type of flash memory, etc. such as magnetic storage devices (e.g., hard disk, floppy disk, magnetic strips, . . . ), optical disks (e.g., compact disc (CD), digital versatile disc (DVD), . . . ), smart cards, flash memory devices, etc. Decomposition description device 100 may have one or more computer-readable media that use the same or a different memory media technology. For example, computer-readable medium 108 may include different types of computer-readable media that may be organized hierarchically to provide efficient access to the data stored therein as understood by a person of skill in the art. As an example, a cache may be implemented in a smaller, faster memory that stores copies of data from the most frequently/recently accessed main memory locations to reduce an access latency. Decomposition description device 100 also may have one or more drives that support the loading of a memory media such as a CD, DVD, an external hard drive, etc. One or more external hard drives further may be connected to decomposition description device 100 using communication interface 106.

Processor 110 executes instructions as understood by those skilled in the art. The instructions may be carried out by a special purpose computer, logic circuits, or hardware circuits. Processor 110 may be implemented in hardware and/or firmware. Processor 110 executes an instruction, meaning it performs/controls the operations called for by that instruction. The term "execution" is the process of running an application or the carrying out of the operation called for by an instruction. The instructions may be written using one or more programming language, scripting language, assembly language, etc. Processor 110 operably couples with input interface 102, with output interface 104, with communication interface 106, and with computer-readable medium 108 to receive, to send, and to process information. Processor 110 may retrieve a set of instructions from a permanent memory device and copy the instructions in an executable form to a temporary memory device that is generally some form of RAM. Decomposition description device 100 may include a plurality of processors that use the same or a different processing technology. Decomposition application 122 performs operations associated with defining dataset decomposition description 126 from data stored in dataset 124. Dataset decomposition description 126 may be used to classify data stored in a second dataset 1024 (shown referring to FIG. 11) and/or to identify outliers in second dataset 1024 to support various data analysis functions as well as provide alert/messaging related to the classified data and/or identified outliers. Some or all of the operations described herein may be embodied in decomposition application 122. The operations may be implemented using hardware, firmware, software, or any combination of these methods.

Referring to the example embodiment of FIG. 1, decomposition application 122 is implemented in software (comprised of computer-readable and/or computer-executable instructions) stored in computer-readable medium 108 and accessible by processor 110 for execution of the instructions that embody the operations of decomposition application 122. Decomposition application 122 may be written using one or more programming languages, assembly languages, scripting languages, etc. Decomposition application 122 may be integrated with other analytic tools. As an example, decomposition application 122 may be part of an integrated data analytics software application and/or software architecture such as that offered by SAS Institute Inc. of Cary, N.C., USA. For example, decomposition application 122 may be part of SAS® Enterprise Miner™ developed and provided by SAS Institute Inc. of Cary, N.C., USA that may be used to create highly accurate predictive and descriptive models based on analysis of vast amounts of data from across an enterprise. Merely for further illustration, decomposition application 122 may be implemented using or integrated with one or more SAS software tools such as Base SAS, SAS/STAT®, SAS® High Performance Analytics Server, SAS® LASR™, SAS® In-Database Products, SAS® Scalable Performance Data Engine, SAS/OR®, SAS/

ETS®, SAS® Inventory Optimization, SAS® Inventory Optimization Workbench, SAS® Visual Analytics, SAS® Viya™, SAS In-Memory Statistics for Hadoop®, SAS® Forecast Server, all of which are developed and provided by SAS Institute Inc. of Cary, N.C., USA. Data mining is applicable in a wide variety of industries.

Decomposition application 122 may be integrated with other system processing tools to automatically process data generated as part of operation of an enterprise, device, system, facility, etc., to classify the processed data, to identify any outliers in the processed data, and/or to provide a warning or alert or other messaging associated with the data classification and/or outlier identification using input interface 102, output interface 104, and/or communication interface 106 so that appropriate action can be initiated in response to the data classification and/or outlier identification.

Decomposition application 122 may be implemented as a Web application. For example, decomposition application 122 may be configured to receive hypertext transport protocol (HTTP) responses and to send HTTP requests. The HTTP responses may include web pages such as hypertext markup language (HTML) documents and linked objects generated in response to the HTTP requests. Each web page may be identified by a uniform resource locator (URL) that includes the location or address of the computing device that contains the resource to be accessed in addition to the location of the resource on that computing device. The type of file or resource depends on the Internet application protocol such as the file transfer protocol, HTTP, H.323, etc. The file accessed may be a simple text file, an image file, an audio file, a video file, an executable, a common gateway interface application, a Java applet, an extensible markup language (XML) file, or any other type of file supported by HTTP.

Dataset 124 may include, for example, a plurality of rows and a plurality of columns. The plurality of rows may be referred to as observation vectors or records (observations), and the columns may be referred to as variables. Dataset 124 may be transposed. Dataset 124 may include unsupervised data. The plurality of variables may define multiple dimensions for each observation vector. An observation vector $x_i$ may include a value for each of the plurality of variables associated with the observation i. Each variable of the plurality of variables may describe a characteristic of a physical object. For example, if dataset 124 includes data related to operation of a vehicle, the variables may include an oil pressure, a speed, a gear indicator, a gas tank level, a tire pressure for each tire, an engine temperature, a radiator level, etc. Dataset 124 may include data captured as a function of time for one or more physical objects. As another example, dataset 124 may include data related to images, where each row includes the pixels that define a single image. The images may be of any item for which image recognition or classification may be performed including, but not limited to, faces, objects, alphanumeric letters, terrain, plants, animals, etc.

The data stored in dataset 124 may be generated by and/or captured from a variety of sources including one or more sensors of the same or different type, one or more computing devices, etc. The data stored in dataset 124 may be received directly or indirectly from the source and may or may not be pre-processed in some manner. For example, the data may be pre-processed using an event stream processor such as the SAS® Event Stream Processing Engine (ESPE), developed and provided by SAS Institute Inc. of Cary, N.C., USA. As used herein, the data may include any type of content represented in any computer-readable format such as binary, alphanumeric, numeric, string, markup language, etc. The data may be organized using delimited fields, such as comma or space separated fields, fixed width fields, using a SAS® dataset, etc. The SAS dataset may be a SAS® file stored in a SAS® library that a SAS® software tool creates and processes. The SAS dataset contains data values that are organized as a table of observations (rows) and variables (columns) that can be processed by one or more SAS software tools.

Dataset 124 may be stored on computer-readable medium 108 or on one or more computer-readable media of distributed computing system 128 and accessed by decomposition description device 100 using communication interface 106, input interface 102, and/or output interface 104. Data stored in dataset 124 may be sensor measurements or signal values captured by a sensor such as a camera, may be generated or captured in response to occurrence of an event or a transaction, generated by a device such as in response to an interaction by a user with the device, etc. The data stored in dataset 124 may include any type of content represented in any computer-readable format such as binary, alphanumeric, numeric, string, markup language, etc. The content may include textual information, graphical information, image information, audio information, numeric information, etc. that further may be encoded using various encoding techniques as understood by a person of skill in the art. The data stored in dataset 124 may be captured at different time points periodically, intermittently, when an event occurs, etc. One or more columns of dataset 124 may include a time and/or date value.

Dataset 124 may include data captured under normal operating conditions of the physical object. Dataset 124 may include data captured at a high data rate such as 200 or more observations per second for one or more physical objects. For example, data stored in dataset 124 may be generated as part of the Internet of Things (IoT), where things (e.g., machines, devices, phones, sensors) can be connected to networks and the data from these things collected and processed within the things and/or external to the things before being stored in dataset 124. For example, the IoT can include sensors in many different devices and types of devices, and high value analytics can be applied to identify hidden relationships and drive increased efficiencies. This can apply to both big data analytics and real-time analytics. Some of these devices may be referred to as edge devices, and may involve edge computing circuitry. These devices may provide a variety of stored or generated data, such as network data or data specific to the network devices themselves. Again, some data may be processed with an ESPE, which may reside in the cloud or in an edge device before being stored in dataset 124.

Dataset 124 may be stored using various structures as known to those skilled in the art including one or more files of a file system, a relational database, one or more tables of a system of tables, a structured query language database, etc. on decomposition description device 100 or on distributed computing system 128. Decomposition description device 100 may coordinate access to dataset 124 that is distributed across distributed computing system 128 that may include one or more computing devices. For example, dataset 124 may be stored in a cube distributed across a grid of computers as understood by a person of skill in the art. As another example, dataset 124 may be stored in a multi-node Hadoop® cluster. For instance, Apache™ Hadoop® is an open-source software framework for distributed computing supported by the Apache Software Foundation. As another example, dataset 124 may be stored in a cloud of computers and accessed using cloud computing technologies, as understood by a person of skill in the art. The SAS® LASR™ Analytic Server may be used as an analytic platform to enable multiple users to concurrently access data stored in dataset 124. The SAS® Viya™ open, cloud-ready, in-memory architecture also may be used as an analytic platform to enable multiple users to concurrently access data stored in dataset 124. SAS Cloud Analytic Services (CAS) may be used as an analytic server with associated cloud services in SAS Viya. Some systems may use SAS In-Memory Statistics for Hadoop® to read big data once and analyze it several times by persisting it in-memory for the entire session. Some systems may be of other types and configurations.

Referring to FIGS. 2A, 2B, 3, 4, 5, 6A, and 6B, example operations associated with decomposition application 122 are described. For example, decomposition application 122 may be used to create dataset decomposition description 126 from dataset 124. Additional, fewer, or different operations may be performed depending on the embodiment of decomposition application 122. The order of presentation of the operations of FIGS. 2A, 2B, 3, 4, 5, 6A, and 6B is not intended to be limiting. Some of the operations may not be performed in some embodiments. Although some of the operational flows are presented in sequence, the various operations may be performed in various repetitions, concurrently (in parallel, for example, using threads and/or a distributed computing system), and/or in other orders than those that are illustrated. For example, a user may execute decomposition application 122, which causes presentation of a first user interface window, which may include a plurality of menus and selectors such as drop down menus, buttons, text boxes, hyperlinks, etc. associated with decomposition application 122 as understood by a person of skill in the art. The plurality of menus and selectors may be accessed in various orders. An indicator may indicate one or more user selections from a user interface, one or more data entries into a data field of the user interface, one or more data items read from computer-readable medium 108 or otherwise defined with one or more default values, etc. that are received as an input by decomposition application 122.

Figure 2A:
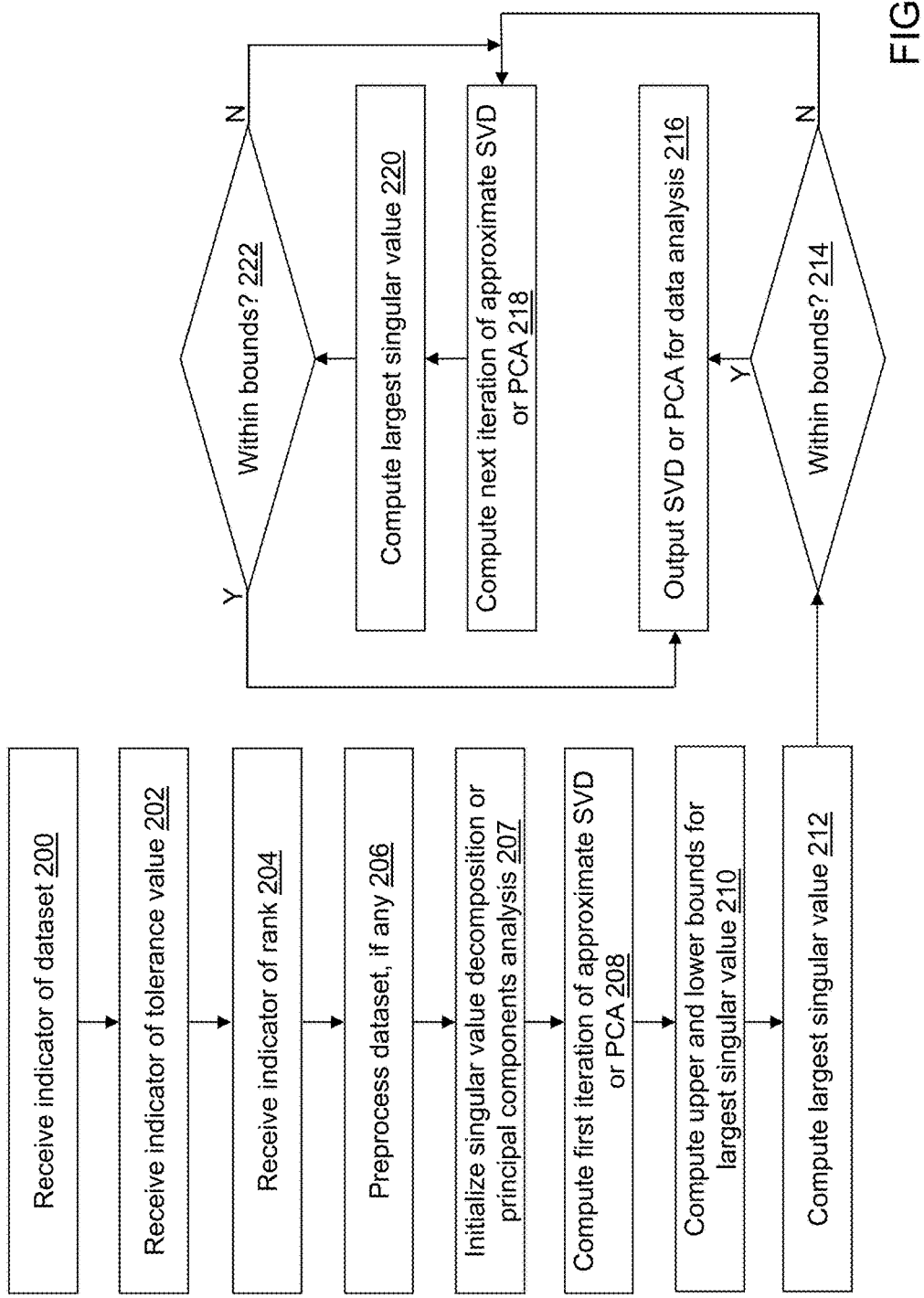
Figure 4:
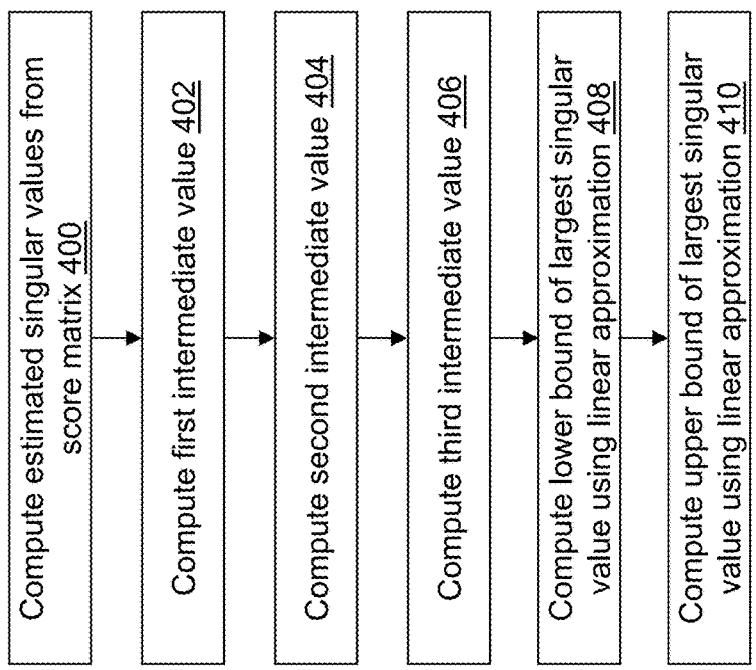

Referring to FIG. 2A, in an operation 200, a first indicator may be received that indicates dataset 124. For example, the first indicator indicates a location and a name of dataset 124. As an example, the first indicator may be received by decomposition application 122 after selection from a user interface window or after entry by a user into a user interface window. In an alternative embodiment, dataset 124 may not be selectable. For example, a most recently created dataset may be used automatically.

In an operation 202, a second indicator may be received that indicates a tolerance value for automatically determining when computation of an approximate decomposition of dataset 124 is sufficiently accurate. In an alternative embodiment, the second indicator may not be received. For example, a default value may be stored, for example, in computer-readable medium 108 and used automatically. In another alternative embodiment, the tolerance value may not be selectable. Instead, a fixed, predefined value may be used. For illustration, the tolerance value may be any value greater than or equal to zero.

In an operation 204, a third indicator may be received that indicates a rank value k for the approximate decomposition of dataset 124. In an alternative embodiment, the third indicator may not be received. For example, a default value may be stored, for example, in computer-readable medium 108 and used automatically. In another alternative embodiment, the rank value may not be selectable. Instead, a fixed, predefined value may be used. The rank value indicates a number of principal components or a number of singular values to compute as part of the decomposition computation.

In an operation 206, dataset 124 is pre-processed if any pre-processing is performed. For illustration, where dataset 124 includes images of faces, the images included in dataset 124 are preferably taken under the same lighting conditions and normalized to have the eyes and mouths aligned across all images. The images may be resampled to have a common pixel resolution defined by a number of rows (r) and columns (c) for each image. Each image is treated as one vector by concatenating the rows of pixels in the original image, resulting in a single row with r×c elements making each row of dataset 124 a single image.

For illustration, dataset 124 can vary widely in size depending upon a number of subjects in dataset 124 and the resolution of the images captured. For example, dataset 124 may be 100×10,0000 for 100 faces represented by 100×100 pixel grayscale images. As part of the pre-processing, an average image may be computed by summing each column and then subtracting the average computed for each column from each respective column value for each image (row) in dataset 124. Different pre-processing may be performed depending on the type of data stored in dataset 124.

In an operation 207, a matrix $Y_0 = X\Omega$ is initialized, where $\Omega$ defines a matrix of random column weights to apply to dataset 124 that is read and input as X.

In an operation 208, a singular value or a principal components decomposition is computed for dataset 124 using a first iteration of an approximate SVD algorithm or PCD algorithm, respectively. For illustration, a PCA procedure performs principal component analysis (PCA) using SAS Viya. As another example, the PRINQUAL procedure performs PCA of qualitative, quantitative, or mixed data using SAS/STAT. PCA is a multivariate technique for examining relationships among several quantitative variables. It provides an optimal way to reduce dimensionality by projecting the data in dataset 124 onto a lower-dimensional orthogonal subspace that explains as much variation as possible in those variables. The PCA procedure can be used to summarize the data and to detect linear relationships. PCA can also be used to reduce the number of variables in regression, clustering, etc. the decomposition may be performed using decomposition description device 100 and/or distributed computing system 128.

Figure 3:
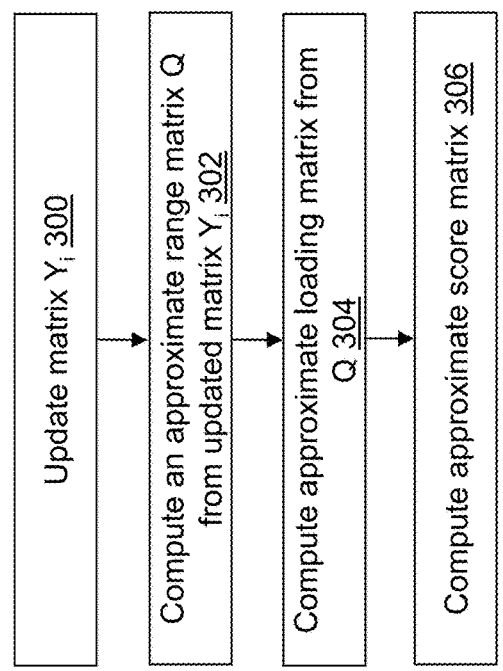

For illustration, referring to FIG. 3, an approximate PCA method is described. In an operation 300, an updated matrix is computed for a next iteration using $Y_i = XX^T Y_{i-1}$, where $Y_0$ is initialized in operation 207.

In an operation 302, an approximate range Q for matrix X is computed from $Y_i$. For illustration, algorithm 4.4 described in N. Halko, P. G. Martinsson, J. A. Tropp, "Finding Structure with Randomness: Probabilistic Algorithms for Constructing Approximate Matrix Decompositions", *SIAM Review*, 53(2), pp. 217-288, 2011, describes a sample computation method.

In an operation 304, an approximate loading matrix $\tilde{W}$ is computed by taking the SVD of matrix $Q^T X$. The approximate loading matrix $\tilde{W}$ consists of the right singular vector(s) of the $Q^T X$.

In an operation 306, an approximate score matrix $\tilde{T}$ is computed using $\tilde{T} = X\tilde{W}$.

Alternatively, an approximate SVD matrix $\tilde{V}$ is computed instead of the approximate loading matrix $\tilde{W}$. SVD computes a factorization of X. Similar to PCD, SVD can be used in signal processing, pattern recognition, classification, outlier detection, event detection, etc. The singular values and right singular vectors of the computed SVD are the approximate singular values and right singular vectors of X. The approximate left singular values of X are given by $\tilde{U}=Q\hat{U}$.

Referring again to FIG. 2A, in an operation 210, upper and lower bounds are computed for the largest singular value. For example, referring to FIG. 4, operations for computing the upper and lower bounds are described.

In an operation 400, a singular value $\tilde{\sigma}_1$ is computed as $\tilde{\sigma}=\|\tilde{t}_j\|_2$, where $j=1, \ldots, k$, $\tilde{t}_j$ is the jth column of the score matrix $\tilde{T}$, and $\|*\|_2$ is a vector 2 norm of $*$.

In an operation 402, a first intermediate value $Z_1$ is computed as $Z_1 = \sum_{j=1}^{k} \tilde{\sigma}_j$.

In an operation 404, a second intermediate value $Z_2$ is computed as $Z_2 = \|\tilde{T}\|_F^2$, where $\|*\|_F$ is a Frobenius matrix norm of $*$.

In an operation 406, a third intermediate value $Z_3$ is computed as $Z_3 = \|X^T\|_F^2$.

In an operation 408, the lower bound for $\sigma_1$, the largest singular value is computed. For example, an approximate lower bound can be computed using $$\sigma_{1,lower} = e^{\left(\frac{1}{10}\left[\log(Z_2) - \log\left(\sum_{j=1}^{k}\sqrt{\tilde{\beta}_j}\right)\right] + \frac{1}{5}\left[\log(Z_3) - \log(\sum_{j=1}^{k}\tilde{\beta}_j)\right]\right)},$$

where $$\tilde{\beta}_j = \frac{\tilde{\sigma}_j^4}{\tilde{\sigma}_1^4}.$$

This is essentially the solution to the least squares problem developed earlier assuming that the approximate solution has converged to the actual solution. Therefore, $\alpha_i = 1$ for $i \leq k$ and 0 otherwise, and $\beta_i = \tilde{\beta}_i$.

Figure 5:
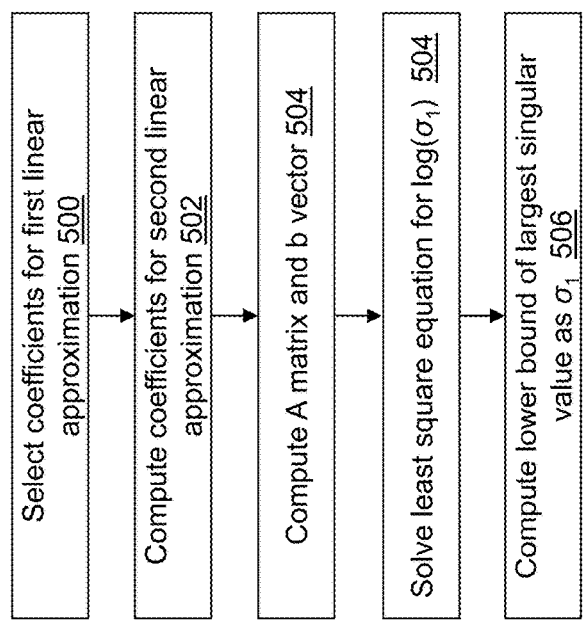

As another illustration, the lower bound can be computed using the operations of FIG. 5. In an operation 500, a first set of coefficients for a first linear approximation to the singular value ratio are selected for the first linear approximation. As an example, the first set of coefficients for the first linear approximation may be selected as $\rho_1 = 1$, $\gamma_1 = 0$, $\rho_2 = 1$, and $\gamma_2 = 0$ so that $\beta^{0.25} = 1$ and $\beta^{0.5} = 1$. Various approaches may be used to form the linear approximation (e.g. Taylor series expansion, least squares fit, etc.). To ensure consistent and correct upper/lower bounds, equation (10) can be rewritten to illustrate the impact of approximation errors. If we assume that only the errors in the first linear approximation are significant, equation (10) can be rewritten as $$\log(Z_1) - \lambda_1 - \log\left(1 + \frac{\sum_{i=1}^{n}\Delta_{i1}\alpha_i}{\rho_1\sum_{i=1}^{n}\beta_i\alpha_i + \gamma_1 k}\right) \approx \tag{13}$$

$$\log(\sigma_1) + (1 + \delta_1)\log\left(\sum_{i=1}^{n}\beta_i\alpha_i\right)$$

$$\log(Z_2) - \lambda_2 - \log\left(1 + \frac{\sum_{i=1}^{n}\Delta_{i2}\alpha_i}{\rho_1\sum_{i=1}^{n}\beta_i\alpha_i + \gamma_2 k}\right) =$$

$$2\log(\sigma_1) + (1 + \delta_2)\log\left(\sum_{i=1}^{n}\beta_i\alpha_i\right)$$

$$\log(Z_3) = 4\log(\sigma_1) + \log\left(\sum_{i=1}^{n}\beta_i\alpha_i\right)$$

where $$\Delta_{i1} = \beta_i^{1/4} - (\rho_1\beta_i + \gamma_1)$$

$$\Delta_{i2} = \beta_i^{1/2} - (\rho_2\beta_i + \gamma_2) \tag{14}$$

Rewriting equation (11) in terms of equation (13) results in $$\begin{bmatrix} \log(\sigma_1) \\ \log\left(\sum_{i=1}^{n}\beta_i\alpha_i\right) \end{bmatrix} = (A^T A)^{-1} A^T (b - \Delta b). \tag{15}$$

Here, $\Delta b$ is given by $$\Delta b = \left[\log\left(1 + \frac{\sum_{i=1}^{n}\Delta_{i1}\alpha_i}{\rho_1\sum_{i=1}^{n}\beta_i\alpha_i + \gamma_1 k}\right) \quad \log\left(1 + \frac{\sum_{i=1}^{n}\Delta_{i2}\alpha_i}{\rho_2\sum_{i=1}^{n}\beta_i\alpha_i + \gamma_2 k}\right) \quad 0\right]^T. \tag{16}$$

For the lower bound computation to hold, the approximation errors $\Delta_{i1}$ and $\Delta_2$ are positive due to the choices for the first linear approximation, the nonzero entries of $\Delta b$ are positive as well. To guarantee a lower bound, elements $c_{11}$ and $c_{12}$ of matrix $$C = (A^T A)^{-1} A^T, \tag{17}$$

must be negative. This condition is satisfied for $\rho_1 = 1$, $\gamma_i = 0$, $\rho_2 = 1$, and $\gamma_2 = 0$. Other values may be used, but may not be guaranteed to have an upper bound. For example, the least squares problem is $$\begin{bmatrix} \log(\sigma_1) \\ \log\left(\sum_{i=1}^{n}\beta_i\alpha_i\right) \end{bmatrix} = Cb - C\Delta b.$$

If the entries of $\Delta b$ are 0, the solution is exact. The signs of $c_{11}$, $c_{12}$, $\Delta b_1$, and $\Delta b_2$ matter because $\log(\sigma_1) = (c_{11}b_1 + c_{12}b_2 + c_{13}b_3) - (c_{11}\Delta b_1 + c_{12}\Delta b_2)$.

The first term in parenthesis is the true largest singular value. The second term being subtracted must be positive to compute a lower bound. There are a number of ways that the value in the second parenthesis could be positive. However, the choice of $\rho_1 = 1$, $\gamma_1 = 0$, $\rho_2 = 1$, and $\gamma_2 = 0$, ensures that $c_{11}$, $c_{12}$, $\Delta b_1$, and $\Delta b_2$ are all negative. Since they are all negative, the products (and the sum) are positive.

In an operation 502, coefficients for the second linear approximation are computed using the first set of coefficients selected for the first linear approximation. The preferred approach is to compute the least squares solutions to $$\begin{bmatrix} \log(x_1) & 1 \\ \log(x_2) & 1 \\ \vdots & \vdots \\ \log(x_l) & 1 \end{bmatrix} \begin{bmatrix} \delta_1 \\ \lambda_1 \end{bmatrix} = \begin{bmatrix} \log\left(\rho_1 + \frac{\gamma_1 k}{x_1}\right) \\ \log\left(\rho_1 + \frac{\gamma_1 k}{x_2}\right) \\ \vdots \\ \log\left(\rho_1 + \frac{\gamma_1 k}{x_l}\right) \end{bmatrix}$$

and $$\begin{bmatrix} \log(x_1) & 1 \\ \log(x_2) & 1 \\ \vdots & \vdots \\ \log(x_l) & 1 \end{bmatrix} \begin{bmatrix} \delta_2 \\ \lambda_2 \end{bmatrix} = \begin{bmatrix} \log\left(\rho_2 + \frac{\gamma_2 k}{x_1}\right) \\ \log\left(\rho_2 + \frac{\gamma_2 k}{x_2}\right) \\ \vdots \\ \log\left(\rho_2 + \frac{\gamma_2 k}{x_l}\right) \end{bmatrix},$$

where $$x_1 = \frac{k}{3}, x_l = k, l$$

is a number of subintervals between $$\frac{k}{3}$$

and k, and $$x_j = x_1 + j\left(\frac{2k}{3l}\right)$$

to solve for $\delta_1$, $\lambda_1$, $\delta_2$, and $\lambda_2$, the second set of coefficients for the second linear approximation.

The most general form of the problems is $\min_q \|Zq-d\|_t$ where $$Z = \begin{bmatrix} \log(x_1) & 1 \\ \log(x_2) & 1 \\ \vdots & \vdots \\ \log(x_l) & 1 \end{bmatrix}$$

$$q = \begin{bmatrix} \delta_1 \\ \lambda_1 \end{bmatrix}$$

$$d = \begin{bmatrix} \log\left(\rho_1 + \frac{\gamma_1 k}{x_1}\right) \\ \log\left(\rho_1 + \frac{\gamma_1 k}{x_2}\right) \\ \vdots \\ \log\left(\rho_1 + \frac{\gamma_1 k}{x_l}\right) \end{bmatrix}$$

and t is a norm to be minimized, wherein t=2 is a least squares problem solved above.

When $\rho_1=1$, $\gamma_1=0$, $\rho_2=1$, and $\gamma_2=0$, the values of $\delta_1$, $\lambda_1$, $\delta_2$, and $\lambda_2$ are all zero.

In an operation 504, the A matrix and b vector of equation (12) are computed using the coefficients computed for the second linear approximation, the first intermediate value $Z_1$, the second intermediate value $Z_2$, and the third intermediate value $Z_3$.

In an operation 506, a log of the largest singular value $\log(\sigma_1)$ is computed using equation (11), the computed A matrix, and the computed b vector.

In an operation 508, the lower bound $\sigma_{1,lower}$ for the largest singular value is computed as an inverse logarithm of $\sigma_{1,lower} = e^{\log(\sigma_1)}$.

Referring again to FIG. 4, in an operation 410, the upper bound for $\sigma_1$, the largest singular value is computed. For example, an approximate upper bound can be computed using the operations of FIG. 6A.

In an operation 600, a fourth indicator of a first norm to apply and a first line fit range over which to apply the first norm for the line fit is received. For example, the fourth indicator indicates a name of the first norm to use in computing a linear curve fit to $\beta_i^{0.25}$ and a first minimum and a first maximum value of $\beta_i$. The fourth indicator may be received by decomposition application 122 after selection from a user interface window or after entry by a user into a user interface window. A default value for the first norm may further be stored, for example, in computer-readable medium 108. As an example, the first norm may be selected from "Absolute Value (L1)", "Euclidian (L2)", etc. Of course, the first norm may be labeled or selected in a variety of different manners by the user as understood by a person of skill in the art. In an alternative embodiment, the first norm may not be selectable, and a single norm is implemented in decomposition application 122. For example, a Euclidian or L2 norm may be used by default or without allowing a selection. Default values for the first minimum and the first maximum value of $\beta_i$ may further be stored, for example, in computer-readable medium 108. In an alternative embodiment, the first minimum and the first maximum value of $\beta_i$ may not be selectable, and default values are used without allowing user selection. For example, studies suggest that fitting a line over the range $0.15 \leq \beta_i \leq 1.0$ works quite well.

In an operation 602, a fifth indicator of a second norm to apply and a second line fit range over which to apply the second norm for the line fit is received. For example, the fifth indicator indicates a name of the second norm to use in computing a linear curve fit to $\beta_i^{0.5}$ and a second minimum and a second maximum value of $\beta_i$. The fifth indicator may be received by decomposition application 122 after selection from a user interface window or after entry by a user into a user interface window. A default value for the second norm may further be stored, for example, in computer-readable medium 108. As an example, the second norm may be selected from "Absolute Value (L1)", "Euclidian (L2)", etc. Of course, the second norm may be labeled or selected in a variety of different manners by the user as understood by a person of skill in the art. In an alternative embodiment, the second norm may not be selectable, and a single norm is implemented in decomposition application 122. For example, a Euclidian or L2 norm may be used by default or without allowing a selection. The first and the second norm and may be the same. Default values for the second minimum and the second maximum value of $\beta_i$ may further be stored, for example, in computer-readable medium 108. In an alternative embodiment, the second minimum and the second maximum value of $\beta_i$ may not be selectable, and default values are used without allowing user selection. Again, studies suggest that fitting a line over the range $0.15 \leq \beta_i \leq 1.0$ works quite well.

In an operation 604, a first line is fit to $\beta^{0.25}$ using the first norm over the range defined by the first minimum and the first maximum value of $\beta_i$ to define $\rho_1$ and $\gamma_1$ of the first set of coefficients for the first linear approximation using $\beta_i^{0.25} = \rho_1 \beta_i + \gamma_1$.

In an operation 606, a second line is fit to $\beta^{0.25}$ using the second norm over the range defined by the second minimum and the second maximum value of $\beta_i$ to define $\rho_2$ and $\gamma_2$ of the first set of coefficients for the first linear approximation using $\beta_i^{0.5} = \rho_2 + \gamma_2$. The first set of coefficients include a slope and an intercept of the fit first line and the fit second line.

In an operation 610, the second set of coefficients for the second linear approximation are computed using the first set of coefficients selected for the first linear approximation. The preferred approach is to compute the least squares solutions to $$\begin{bmatrix} \log(x_1) & 1 \\ \log(x_2) & 1 \\ \vdots & \vdots \\ \log(x_l) & 1 \end{bmatrix} \begin{bmatrix} \delta_1 \\ \lambda_1 \end{bmatrix} = \begin{bmatrix} \log\left(\rho_1 + \frac{\gamma_1 k}{x_1}\right) \\ \log\left(\rho_1 + \frac{\gamma_1 k}{x_2}\right) \\ \vdots \\ \log\left(\rho_1 + \frac{\gamma_1 k}{x_l}\right) \end{bmatrix}$$

and $$\begin{bmatrix} \log(x_1) & 1 \\ \log(x_2) & 1 \\ \vdots & \vdots \\ \log(x_l) & 1 \end{bmatrix} \begin{bmatrix} \delta_2 \\ \lambda_2 \end{bmatrix} = \begin{bmatrix} \log\left(\rho_2 + \frac{\gamma_2 k}{x_1}\right) \\ \log\left(\rho_2 + \frac{\gamma_2 k}{x_2}\right) \\ \vdots \\ \log\left(\rho_2 + \frac{\gamma_2 k}{x_l}\right) \end{bmatrix},$$

where $$x_1 = \frac{k}{3}, x_l = k,$$

and $$x_j = x_1 + j\left(\frac{2k}{3l}\right)$$

to solve for $\delta_1$, $\lambda_1$, $\delta_2$, and $\lambda_2$, the second set of coefficients for the second linear approximation.

In an operation 612, the A matrix and b vector of equation (12) are computed using the coefficients computed for the second linear approximation, the first intermediate value $Z_1$, the second intermediate value $Z_2$, and the third intermediate value $Z_3$.

In an operation 614, a log of the largest singular value $\log(\sigma_1)$ is computed using equation (11), the computed A matrix, and the computed b vector.

In an operation 616, the upper bound $\sigma_{1,upper}$ for the largest singular value is computed as an inverse logarithm of $\sigma_{1,upper} = e^{\log(\sigma_1)}$.

Figure 6A:
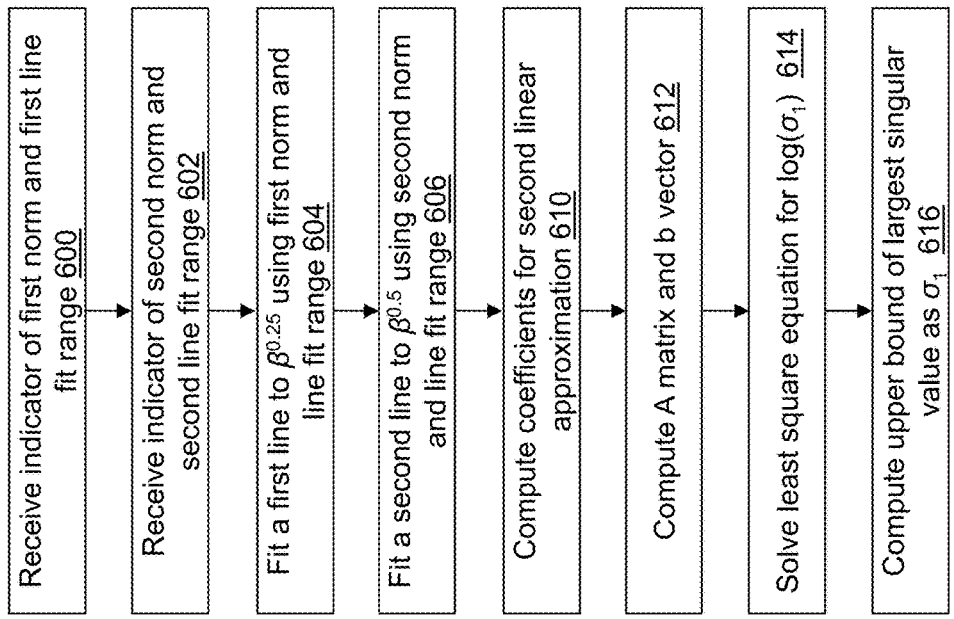
Figure 6B:
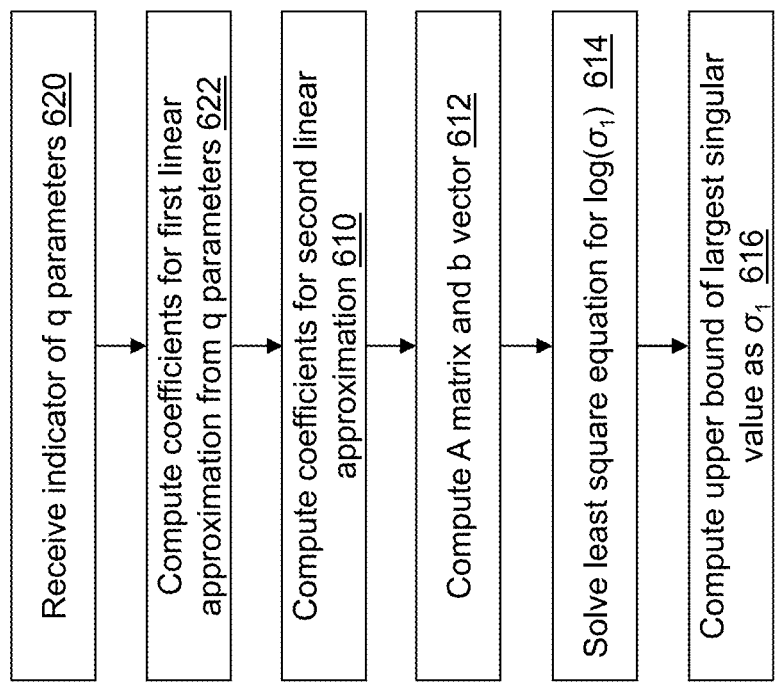

As another illustration, the upper bound can be computed using the operations of FIG. 6B. In an operation 620, a seventh indicator of values for q parameters, $q_1$ and $q_2$, is received. The seventh indicator may be received by decomposition application 122 after selection from a user interface window or after entry by a user into a user interface window. Default values for $q_1$ and $q_2$ may further be stored, for example, in computer-readable medium 108. In an alternative embodiment, $q_1$ and $q_2$, may not be selectable, and default values are used without allowing user selection. The q parameters, $q_1$ and $q_2$, may be selected where $0 \leq q_1 \leq 1$, and $0 \leq q_2 \leq 1$.

A truncated Taylor series expansion of $\beta^{1/4}$ at $q_1$ and $\beta^{1/2}$ at $q_2$ may be performed. Using a truncated Taylor series ensures that the approximation errors are all negative to guarantee an upper bound. Not all choices of $q_1$ and $q_2$ lead to good/tight upper bounds, but many valid choices exist. The approximation errors $\Delta_{i1}$ and $\Delta_{i2}$ are negative due to the nature of the truncated Taylor series expansion. Because the denominators of the expressions for $\Delta b$ are positive, the two non-zero entries of $\Delta b$ must be negative. To guarantee an upper bound, $c_{11}$ and $c_{12}$, must once again be negative. To determine the q parameters, a two-dimensional search for the Taylor series parameters, $q_1$ and $q_2$, using the criterion just established and representative data matrices can be performed. Experimentations has shown that suitable choices for $q_1$ and $q_2$ that minimize the upper bound may be obtained without sensitivity to the particular data matrices employed. For illustration, $q_1 = 0.68$ and $q_2 = 0.48$ have been computed using this procedure summarized below:

1. Randomly draw X matrix,
2. Set $q_1 = 0.01$
3. Set $q_2 = 0.01$
4. Compute A matrix and C matrix,
5. If $c_{11} > 0$ or $c_{12} > 0$ then $q_2 = q_2 + 0.01$ and return to step 4,
6. Compute upper bound,
7. If upper bound minimum value that exceeds $\sigma_1$, then save $q_1$ and $q_2$,
8. $q_2 = q_2 + 0.01$
9. If $q_2 \leq 1.0$ then return to step 4,
10. $q_1 = q_1 + 0.01$,
11. If $q \leq 1.0$ then return to step 3.

In an operation 622, the first set of coefficients are selected for the first linear approximation. As an example, the first set of coefficients for the first linear approximation may be selected as $\rho_1 = 0.25 q_1^{-3/4}$, $\gamma_1 = 0.75 q_1^{1/4}$, $\rho_2 = 0.5 q_2^{-1/2}$, and $\gamma_2 = 0.5 q_2^{1/2}$ using the indicated values for the q parameters $q_1$ and $q_2$.

Again, in operation 610, the second set of coefficients for the second linear approximation are computed using the first set of coefficients selected for the first linear approximation. The preferred approach is to compute the least squares solutions to $$\begin{bmatrix} \log(x_1) & 1 \\ \log(x_2) & 1 \\ \vdots & \vdots \\ \log(x_l) & 1 \end{bmatrix} \begin{bmatrix} \delta_1 \\ \lambda_1 \end{bmatrix} = \begin{bmatrix} \log\left(\rho_1 + \frac{\gamma_1 k}{x_1}\right) \\ \log\left(\rho_1 + \frac{\gamma_1 k}{x_2}\right) \\ \vdots \\ \log\left(\rho_1 + \frac{\gamma_1 k}{x_l}\right) \end{bmatrix}$$

and $$\begin{bmatrix} \log(x_1) & 1 \\ \log(x_2) & 1 \\ \vdots & \vdots \\ \log(x_l) & 1 \end{bmatrix} \begin{bmatrix} \delta_2 \\ \lambda_2 \end{bmatrix} = \begin{bmatrix} \log\left(\rho_2 + \frac{\gamma_2 k}{x_1}\right) \\ \log\left(\rho_2 + \frac{\gamma_2 k}{x_2}\right) \\ \vdots \\ \log\left(\rho_2 + \frac{\gamma_2 k}{x_l}\right) \end{bmatrix},$$

where $$x_1 = \frac{k}{3}, x_l = k,$$

and $$x_j = x_1 + j\left(\frac{2k}{3l}\right)$$

to solve for $\delta_1$, $\lambda_1$, $\delta_2$, and $\lambda_2$, the second set of coefficients for the second linear approximation.

Again, in operation 612, the A matrix and b vector of equation (12) are computed using the coefficients computed for the second linear approximation, the first intermediate value $Z_1$, the second intermediate value $Z_2$, and the third intermediate value $Z_3$.

Again, in operation 614, a log of the largest singular value $\log(\sigma_1)$ is computed using equation (11), the computed A matrix, and the computed b vector.

Again, in operation 616, the upper bound $\sigma_{1,upper}$ for the largest singular value is computed as an inverse logarithm of $\sigma_{1,upper} = e^{\log(\sigma_1)}$.

Referring again to FIG. 2A, in an operation 212, a largest singular value is computed as a norm of a first column of the score matrix $\tilde{T}$ or obtained directly from the approximate SVD matrix.

In an operation 214, a determination is made concerning whether or not the computed largest singular value is between the computed upper and lower bounds within the tolerance value indicated in operation 202. When the computed largest singular value is within the bounds, processing continues in an operation 216. When the computed largest singular value is not within the bounds, processing continues in operation 208 to repeat a next computation of the SVD or PCD.

In operation 216, the SVD or PCD are output, for example, by storing them as dataset decomposition description 126, and processing is complete for defining dataset decomposition description 126. For example, using the PCD, either or both of the score matrix and the loadings matrix may be output. For example, using the SVD, one or more of the left singular vectors, the right singular vectors, and the singular values may be output.

In an operation 218, the singular value or the principal components decomposition is computed for dataset 124 using a next iteration of the approximate SVD algorithm or PCD algorithm, respectively.

Similar to operation 212, in an operation 220, a largest singular value is computed as a norm of a first column of the score matrix $\tilde{T}$ or obtained directly from the approximate SVD matrix.

Similar to operation 214, in an operation 222, a determination is made concerning whether or not the computed largest singular value is between the computed upper and lower bounds within the tolerance value indicated in operation 202. When the computed largest singular value is within the bounds, processing continues in operation 216. When the computed largest singular value is not within the bounds, processing continues in operation 218 to repeat a next computation of the SVD or PCD.

Referring to FIG. 2B, alternative computations for computing the SVD or PCD are described. Again, in operation 200, a first indicator may be received that indicates dataset 124.

In an operation 224, a sixth indicator may be received that indicates a number of iterations for automatically determining when computation of an approximate decomposition of dataset 124 is sufficiently accurate. In an alternative embodiment, the sixth indicator may not be received. For example, a default value may be stored, for example, in computer-readable medium 108 and used automatically. In another alternative embodiment, the number of iterations may not be selectable. Instead, a fixed, predefined value may be used. For illustration, the number of iterations may be any value greater than or equal to one.

Again, in operation 204, the third indicator may be received that indicates a rank value for the approximate decomposition of dataset 124.

Again, in operation 206, dataset 124 is pre-processed if any pre-processing is performed.

Again, in operation 207, the matrix $Y_0 = X\Omega$ is initialized, where $\Omega$ defines a matrix of random column weights to apply to dataset 124 that is read and input as X.

Again, in operation 208, the singular value or the principal components decomposition is computed for dataset 124 using a first iteration of an approximate SVD algorithm or PCD algorithm, respectively.

Again, in operation 210, the upper and lower bounds are computed for the largest singular value.

Again, in operation 218, the singular value or the principal components decomposition is computed for dataset 124 using a next iteration of the approximate SVD algorithm or PCD algorithm, respectively.

Again, in operation 212, the largest singular value is computed as a norm of a first column of the score matrix $\tilde{T}$ or obtained directly from the approximate SVD matrix.

In an operation 226, a determination is made concerning whether or not the number of iterations indicated in operation 224 has been performed. When the number of iterations has been performed, processing continues in an operation 228. When the number of iterations has not been performed, processing continues in operation 218 to repeat a next computation of the SVD or PCD.

In operation 228, the computed SVD or PCD are presented to a user for review, for example, using display 116. The computed upper and lower bounds and the computed largest singular value may be presented in addition to the computed SVD or PCD or in the alternative.

In an operation 230, a determination is made concerning whether or not the user indicates acceptance of the computed SVD or PCD. When the user indicates acceptance, processing continues in operation 216. When the user does not indicate acceptance, processing continues in an operation 232.

In operation 232, the number of iterations completed is reset, for example, to zero or one depending on the iteration counter and test in operation 226, and processing continues in operation 208 to repeat a next set of the number of iterations for computation of the SVD or PCD.

Again, in operation 216, the SVD or PCD are output, for example, by storing them as dataset decomposition description 126, and processing is complete for defining dataset decomposition description 126.

Referring to FIGS. 9A-9F, a performance of decomposition application 122 has been studied empirically for matrices of varying sizes and ranks. The results shown in FIGS. 9A-9F used a 2000×2000 matrix of rank 5, 50, or 200. 15 singular values were extracted and the results for 250 different realizations of a sample matrix were extracted. For example, the sample matrix may be computed using $X=X_1 X_2$, where $X_1$ was a 2000×k matrix and $X_2$ was a k×2000 matrix. All matrix elements from both $X_1$ and $X_2$ were obtained by independent random draws from a standard normal distribution. A realization refers to a particular random draw to matrices $X_1$ and $X_2$.

Figure 9A:
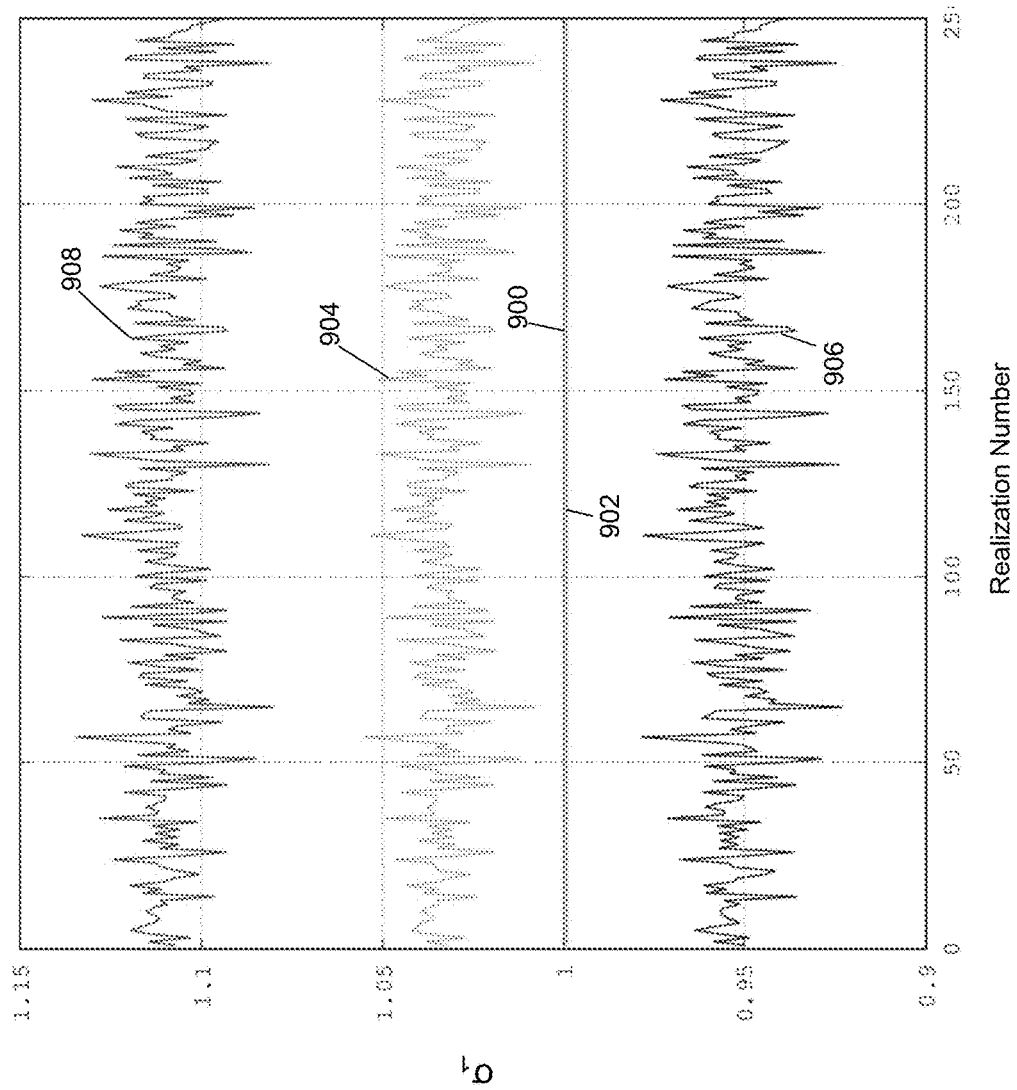
FIG. 9A depicts upper and lower bound values computed by the decomposition description device of FIG. 1 using a rank value of 5 and a single iteration in accordance with illustrative embodiments.

Referring to FIG. 9A, the results for the 250 different realizations are shown based on a rank value k=5 and a number of iterations in operation 220 equal to one. Each graph represents a ratio value relative to the true value $\sigma_{1true}$ of the largest singular value. As a result, a first curve 900 is equal to one and represents $\sigma_{1true}/\sigma_{1true}$. A second curve 902 represents $\sigma_{\sim1lower}/\sigma_{1true}$, where $\sigma_{\sim1lower}$ was computed using operation 408 and $$e^{\left(\frac{1}{10}\left[\log(Z_2)-\log\left(\sum_{j=1}^k \sqrt{\tilde{\beta}_j}\right)\right]+\frac{1}{5}\left[\log(Z_3)-\log(\sum_{j=1}^k \tilde{\beta}_j)\right]\right)}.$$

A third curve 904 represents $\sigma_{\sim1upper}/\sigma_{1true}$, where $\sigma_{\sim1upper}$ was computed using operations 600-616 of FIG. 6A. A fourth curve 906 represents $\sigma_{1lower}/\sigma_{1true}$, where $\sigma_{1lower}$ was computed using operations 500-506 of FIG. 5. A fifth curve 908 represents $\sigma_{1upper}/\sigma_{1true}$, where $\sigma_{1upper}$ was computed using operations 620-616 of FIG. 6B. The bounds are generally within ±10% of the true singular value. The approximate bounds are (generally) much tighter than the guaranteed bounds.

However, there are some scenarios where the approximate bounds are incorrect.

Figure 9B:
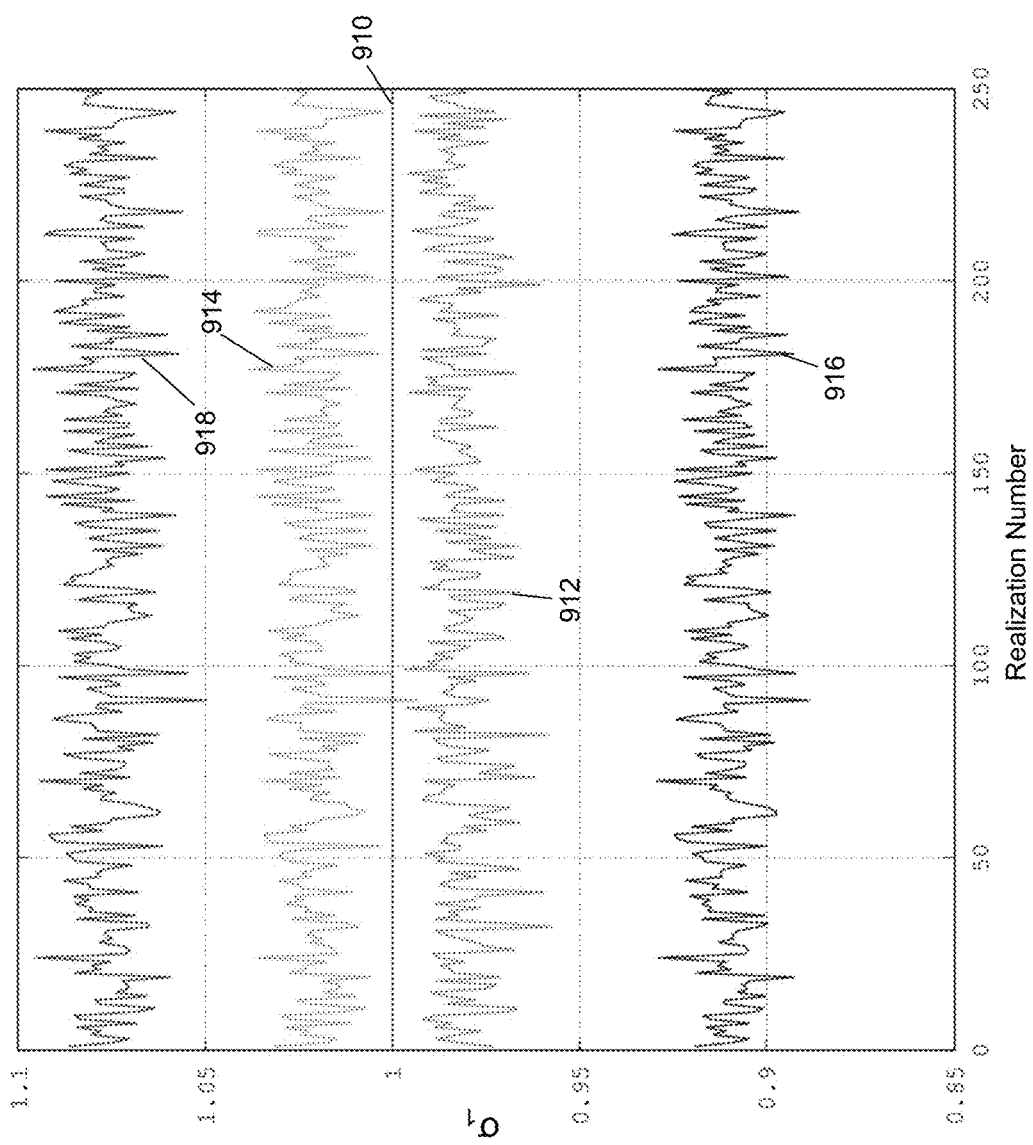
FIG. 9B depicts upper and lower bound values computed by the decomposition description device of FIG. 1 using a rank value of 50 and a single iteration in accordance with illustrative embodiments.

Referring to FIG. 9B, the results for the 250 different realizations are shown based on a rank value k=50 and a number of iterations in operation 220 equal to one. Similarly, a first curve 910 is equal to one and represents $\sigma_{1true}/\sigma_{1true}$.

A second curve 912 represents $\sigma_{\sim1lower}/\sigma_{1true}$, where a $\sigma_{\sim1lower}$ was computed using operation 408 and $$e^{\left(\frac{1}{10}\left[\log(Z_2)-\log\left(\sum_{j=1}^k \sqrt{\tilde{\beta}_j}\right)\right]+\frac{1}{5}\left[\log(Z_3)-\log(\sum_{j=1}^k \tilde{\beta}_j)\right]\right)}.$$

A third curve 914 represents $\sigma_{\sim1upper}/\sigma_{1true}$, where $\sigma_{\sim1upper}$ was computed using operations 600-616 of FIG. 6A. A fourth curve 916 represents $\sigma_{1lower}/\sigma_{1true}$, where $\alpha_{1lower}$ was computed using operations 500-506 of FIG. 5. A fifth curve 918 represents $\sigma_{1upper}/\sigma_{1true}$, where $\rho_{1upper}$ was computed using operations 620-616 of FIG. 6B.

Referring to FIG. 9C, the results for the 250 different realizations are shown based on a rank value k=200 and a number of iterations in operation 220 equal to one. Similarly, a first curve 920 is equal to one and represents $\sigma_{1true}/\sigma_{1true}$. A second curve 922 represents $\sigma_{\sim1lower}/\sigma_{1true}$, where $\sigma_{\sim1lower}$ was computed using operation 408 and $$e^{\left(\frac{1}{10}\left[\log(Z_2)-\log\left(\sum_{j=1}^k \sqrt{\tilde{\beta}_j}\right)\right]+\frac{1}{5}\left[\log(Z_3)-\log(\sum_{j=1}^k \tilde{\beta}_j)\right]\right)}.$$

A third curve 924 represents $\sigma_{1upper}/\sigma_{1true}$, where $\sigma_{\sim1upper}$ was computed using operations 600-616 of FIG. 6A. A fourth curve 926 represents $\sigma_{1lower}/\sigma_{1true}$, where $\sigma_{1lower}$ was computed using operations 500-506 of FIG. 5. A fifth curve 928 represents $\sigma_{1upper}/\sigma_{1true}$, where $\sigma_{1upper}$ was computed using operations 620-616 of FIG. 6B.

Referring to FIG. 9D, the results for the 250 different realizations are shown based on a rank value k=5 and a number of iterations in operation 220 equal to ten. Similarly, a first curve 930 is equal to one and represents $\sigma_{1true}/\sigma_{1true}$. A second curve 932 represents $\sigma_{\sim1lower}/\sigma_{1true}$, where $\sigma_{\sim1lower}$ was computed using operation 408 and $$e^{\left(\frac{1}{10}\left[\log(Z_2)-\log\left(\sum_{j=1}^k \sqrt{\tilde{\beta}_j}\right)\right]+\frac{1}{5}\left[\log(Z_3)-\log(\sum_{j=1}^k \tilde{\beta}_j)\right]\right)}.$$

A third curve 934 represents $\sigma_{\sim1upper}/\sigma_{1true}$, where $\sigma_{\sim1upper}$ was computed using operations 600-616 of FIG. 6A. A fourth curve 936 represents $\sigma_{1lower}/\sigma_{1true}$, where $\sigma_{1lower}$ was computed using operations 500-506 of FIG. 5. A fifth curve 938 represents $\sigma_{1upper}/\sigma_{1true}$, where $\sigma_{1upper}$ was computed using operations 620-616 of FIG. 6B.

Figure 9E:
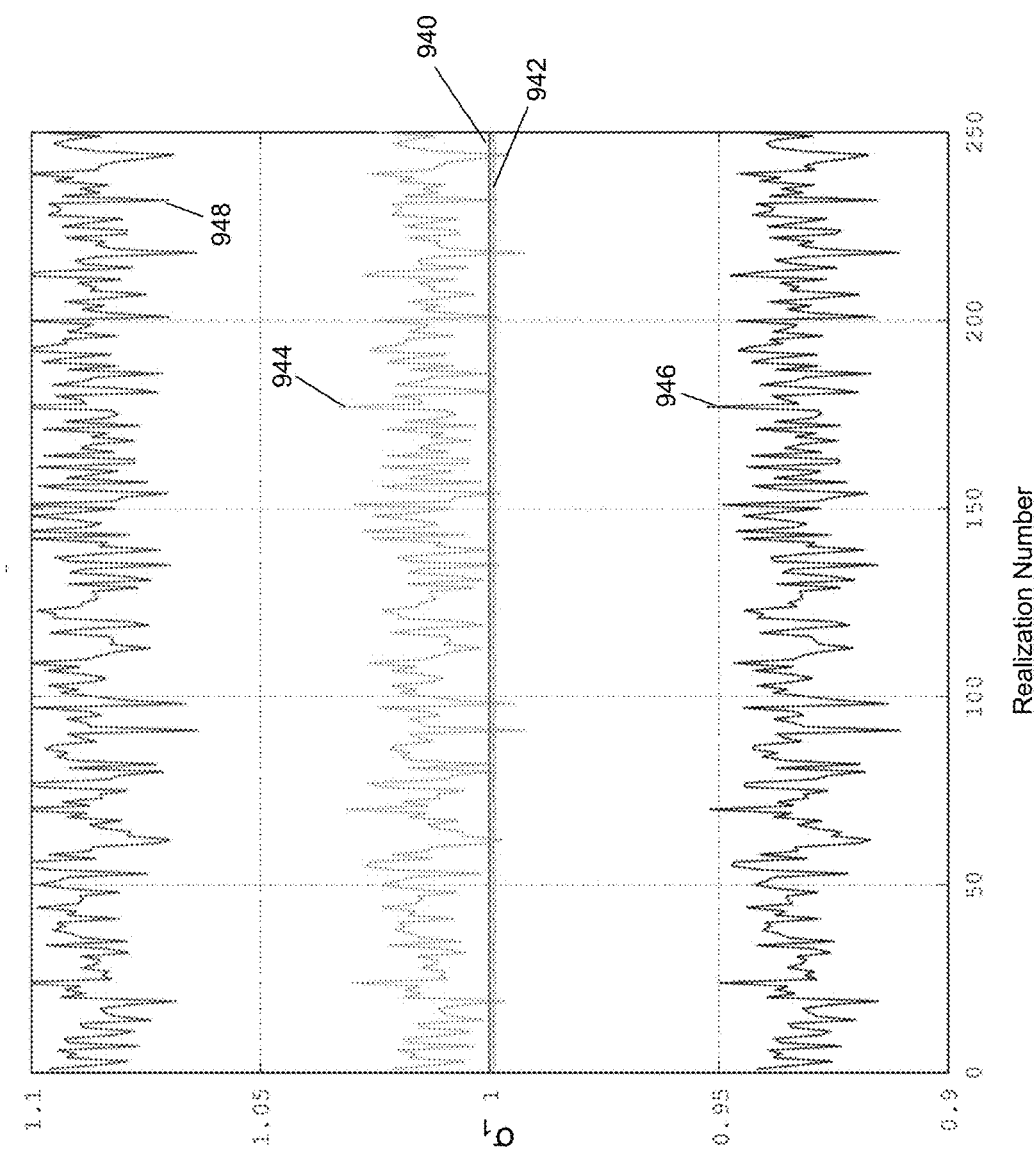
FIG. 9E depicts upper and lower bound values computed by the decomposition description device of FIG. 1 using a rank value of 50 and ten iterations in accordance with illustrative embodiments.

Referring to FIG. 9E, the results for the 250 different realizations are shown based on a rank value k=50 and a number of iterations in operation 220 equal to ten. Similarly, a first curve 940 is equal to one and represents $\sigma_{1true}/\sigma_{1true}$. A second curve 942 represents $\sigma_{\sim1lower}/\sigma_{1true}$, where $\sigma_{\sim1lower}$ was computed using operation 408 and $$e^{\left(\frac{1}{10}\left[\log(Z_2)-\log\left(\sum_{j=1}^k \sqrt{\tilde{\beta}_j}\right)\right]+\frac{1}{5}\left[\log(Z_3)-\log(\sum_{j=1}^k \tilde{\beta}_j)\right]\right)}.$$

A third curve 944 represents $\sigma_{\sim1upper}/\sigma_{1true}$, where $\sigma_{\sim1upper}$ was computed using operations 600-616 of FIG. 6A. A fourth curve 946 represents $\sigma_{1lower}/\sigma_{1true}$, where $\sigma_{1lower}$ was computed using operations 500-506 of FIG. 5. A fifth curve 948 represents $\sigma_{1upper}/\sigma_{1true}$, where $\sigma_{1upper}$ was computed using operations 620-616 of FIG. 6B.

Figure 9F:
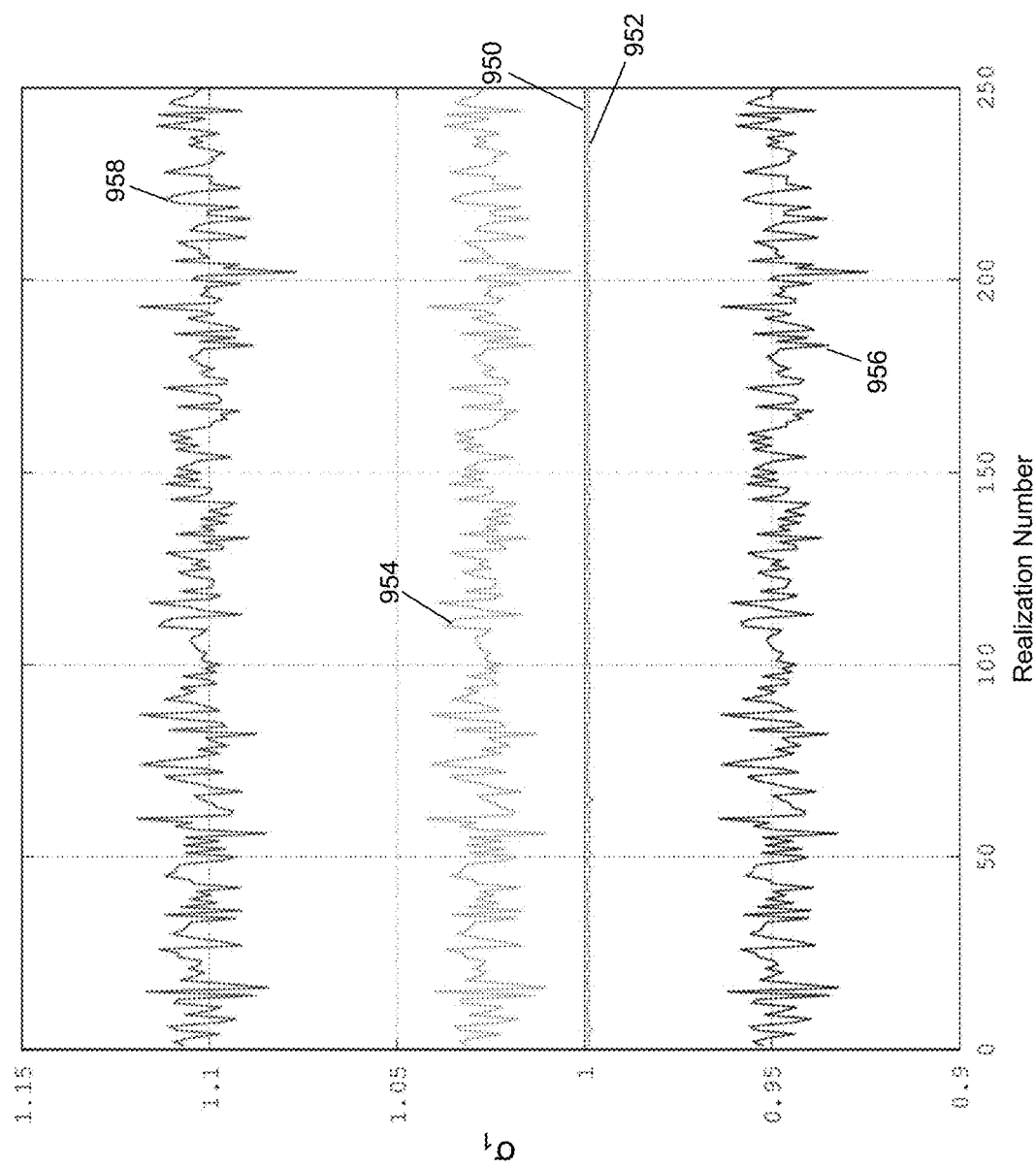
FIG. 9F depicts upper and lower bound values computed by the decomposition description device of FIG. 1 using a rank value of 200 and ten iterations in accordance with illustrative embodiments.

Referring to FIG. 9F, the results for the 250 different realizations are shown based on a rank value k=200 and a number of iterations in operation 220 equal to ten. Similarly, a first curve 950 is equal to one and represents $\sigma_{1true}/\sigma_{1true}$. A second curve 952 represents $\sigma_{\sim1lower}/\sigma_{1true}$, where $\sigma_{\sim1lower}$ was computed using operation 408 and $$e^{\left(\frac{1}{10}\left[\log(Z_2)-\log\left(\sum_{j=1}^k \sqrt{\tilde{\beta}_j}\right)\right]+\frac{1}{5}\left[\log(Z_3)-\log(\sum_{j=1}^k \tilde{\beta}_j)\right]\right)}.$$

A third curve 954 represents $\sigma_{\sim1upper}/\sigma_{1true}$, where $\sigma_{\sim1upper}$ was computed using operations 600-616 of FIG. 6A. A fourth curve 956 represents $\sigma_{1lower}/\sigma_{1true}$, where $\sigma_{1lower}$ was computed using operations 500-506 of FIG. 5. A fifth curve 958 represents $\sigma_{1upper}/\sigma_{1true}$, where $\sigma_{1upper}$ was computed using operations 620-616 of FIG. 6B.

There are other variations for defining $\beta_i$. For example, $$\beta_i = \frac{\sigma_i}{\sigma_1}$$

may be defined resulting in $$Z_1 \approx \sigma_1 \sum_{i=1}^{n} \beta_i \alpha_i \quad (18)$$

$$Z_2 = \sigma_1^2 \sum_{i=1}^{n} \beta_i^2 \alpha_i .$$

$$Z_3 = \sigma_1^4 \sum_{i=1}^{n} \beta_i^4 \alpha_i$$

Alternatively, $$\beta_i = \frac{\sigma_i^2}{\sigma_1^2},$$

may be defined resulting in $$Z_1 \approx \sigma_1 \sum_{i=1}^{n} \sqrt{\beta_i} \, \alpha_i \quad (19)$$

$$Z_2 = \sigma_1^2 \sum_{i=1}^{n} \beta_i \alpha_i .$$

$$Z_3 = \sigma_1^4 \sum_{i=1}^{n} \beta_i^2 \alpha_i$$

In any case, the series of operations of FIGS. 4, 5, 6A, and 6B remain unchanged. The difference lies in the computation of the first linear approximation. The method outlined above for selecting $q_1$ and $q_2$ can still be employed, but certain modifications are necessary since the errors in approximating $\beta^2$ or $\beta^4$ are positive using the truncated Taylor series approach.

Decomposition application 122 provides a clear, mathematically-motivated range for the largest singular value of dataset 124. The upper and lower bounds have been shown empirically to be relatively tight, and should provide feedback to a user of a randomized SVD or PCD algorithm. There are applications for decomposition application 122 in areas such as process control and equipment health monitoring, image processing and classification, data segmentation, etc. Dataset 124 may include sensor readings measuring multiple key health or process parameters at a very high frequency.

Figure 10:
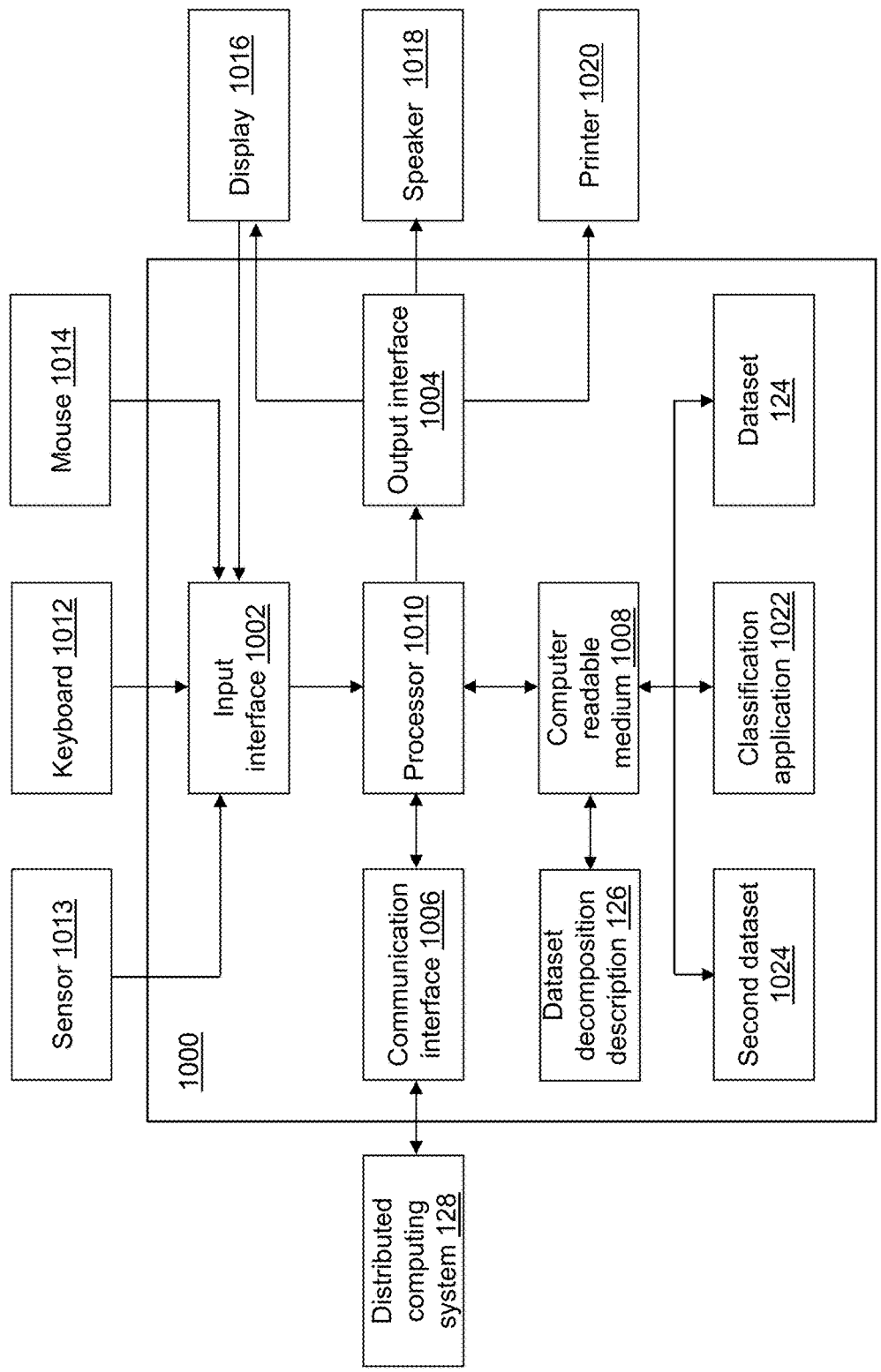
FIG. 10 depicts a block diagram of a classification device in accordance with an illustrative embodiment.

Referring to FIG. 10, a block diagram of a classification device 1000 is shown in accordance with an illustrative embodiment. Classification device 1000 may include a second input interface 1002, a second output interface 1004, a second communication interface 1006, a second non-transitory computer-readable medium 1008, a second processor 1010, an classification application 0122, dataset decomposition description 126, a second dataset 1024, and dataset 124. Fewer, different, and/or additional components may be incorporated into classification device 1000. Classification device 1000 and decomposition description device 100 may be the same or different devices.

Second input interface 1002 provides the same or similar functionality as that described with reference to input interface 102 of decomposition description device 100 though referring to classification device 1000. Second output interface 1004 provides the same or similar functionality as that described with reference to output interface 104 of decomposition description device 100 though referring to classification device 1000. Second communication interface 1006 provides the same or similar functionality as that described with reference to communication interface 106 of decomposition description device 100 though referring to classification device 1000. Data and messages may be transferred between classification device 1000 and distributed computing system 128 using second communication interface 1006. Second computer-readable medium 1008 provides the same or similar functionality as that described with reference to computer-readable medium 108 of decomposition description device 100 though referring to classification device 1000. Second processor 1010 provides the same or similar functionality as that described with reference to processor 110 of decomposition description device 100 though referring to classification device 1000.

Classification application 1022 performs operations associated with classifying data stored in second dataset 1024 and/or identifying outliers in second dataset 1024 to support various data analysis functions as well as provide alert/messaging related to the classified data and/or identified outliers. Dependent on the type of data stored in dataset 124 and second dataset 1024, classification application 1022 may identify anomalies as part of process control, for example, of a manufacturing process, for machine condition monitoring, for example, an electro-cardiogram device, for image classification, for intrusion detection, for fraud detection, etc. Some or all of the operations described herein may be embodied in classification application 1022. The operations may be implemented using hardware, firmware, software, or any combination of these methods.

Referring to the example embodiment of FIG. 10, classification application 1022 is implemented in software (comprised of computer-readable and/or computer-executable instructions) stored in second computer-readable medium 1008 and accessible by second processor 1010 for execution of the instructions that embody the operations of classification application 1022. Classification application 1022 may be written using one or more programming languages, assembly languages, scripting languages, etc. Classification application 1022 may be integrated with other analytic tools. As an example, classification application 1022 may be part of an integrated data analytics software application and/or software architecture such as that offered by SAS Institute Inc. of Cary, N.C., USA. For example, classification application 1022 may be part of SAS® Enterprise Miner™ developed and provided by SAS Institute Inc. of Cary, N.C., USA that may be used to create highly accurate predictive and descriptive models based on analysis of vast amounts of data from across an enterprise. Merely for further illustration, classification application 1022 may be implemented using or integrated with one or more SAS software tools such as Base SAS, SAS/STAT®, SAS® High Performance Analytics Server, SAS® LASR™, SAS® In-Database Products, SAS® Scalable Performance Data Engine, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, all of which are developed and provided by SAS Institute Inc. of Cary, N.C., USA. One or more operations of classification application 1022 further may be performed by an ESPE. Classification application 1022 and decomposition application 122 further may be integrated applications.

Classification application 1022 may be implemented as a Web application. Classification application 1022 may be integrated with other system processing tools to automatically process data generated as part of operation of an enterprise, to classify data in the processed data, to identify any outliers in the processed data, and/or to provide a warning or alert associated with the data classification and/or outlier identification using second input interface 1002, second output interface 1004, and/or second communication interface 1006 so that appropriate action can be initiated in response. For example, a warning or an alert may be presented using a second display 1016, a second speaker 1018, a second printer 1020, etc. or sent to one or more computer-readable media, display, speaker, printer, etc. of distributed computing system 128.

Dataset 124 and second dataset 1024 may be generated, stored, and accessed using the same or different mechanisms. Similar to dataset 124, second dataset 1024 may include a plurality of rows and a plurality of columns with the plurality of rows referred to as observations or records, and the columns referred to as variables that are associated with an observation. Second dataset 1024 may be transposed.

Similar to dataset 124, second dataset 1024 may be stored on second computer-readable medium 1008 or on one or more computer-readable media of distributed computing system 128 and accessed by classification device 1000 using second communication interface 1006. Data stored in second dataset 1024 may be a sensor measurement or a data communication value, for example, from a sensor 1013, may be generated or captured in response to occurrence of an event or a transaction, generated by a device such as in response to an interaction by a user with the device, for example, from a second keyboard 1012 or a second mouse 1014, etc. The data stored in second dataset 1024 may include any type of content represented in any computer-readable format such as binary, alphanumeric, numeric, string, markup language, etc. The content may include textual information, graphical information, image information, audio information, numeric information, etc. that further may be encoded using various encoding techniques as understood by a person of skill in the art. The data stored in second dataset 1024 may be captured at different time points periodically, intermittently, when an event occurs, etc. One or more columns may include a time value. Similar to dataset 124, data stored in second dataset 1024 may be generated as part of the IoT, and some or all data may be pre- or post-processed by an ESPE.

Similar to dataset 124, second dataset 1024 may be stored in various compressed formats such as a coordinate format, a compressed sparse column format, a compressed sparse row format, etc. Second dataset 1024 further may be stored using various structures as known to those skilled in the art including a file system, a relational database, a system of tables, a structured query language database, etc. on decomposition description device 100, on classification device 1000, and/or on distributed computing system 128. Classification device 1000 and/or distributed computing system 128 may coordinate access to second dataset 1024 that is distributed across a plurality of computing devices. For example, second dataset 1024 may be stored in a cube distributed across a grid of computers as understood by a person of skill in the art. As another example, second dataset 1024 may be stored in a multi-node Hadoop® cluster. As another example, second dataset 1024 may be stored in a cloud of computers and accessed using cloud computing technologies, as understood by a person of skill in the art. The SAS® LASR™ Analytic Server and/or SAS® Viya™ may be used as an analytic platform to enable multiple users to concurrently access data stored in second dataset 1024.

For illustration, an image recognition system typically has two modes of operation. The first is called the training mode, where a database of images is processed and salient features are extracted. The second is called the recognition mode, where images are presented to the system and either matched to the training database or rejected as unrecognized. For facial recognition, principal components have been shown to be particularly useful features. To extract salient features from a dataset 124 that includes 100 faces represented by relatively low resolution 100×100 pixel grayscale images as discussed previously, operations 200-216 of FIG. 2A are performed using PCD.

Figure 11:
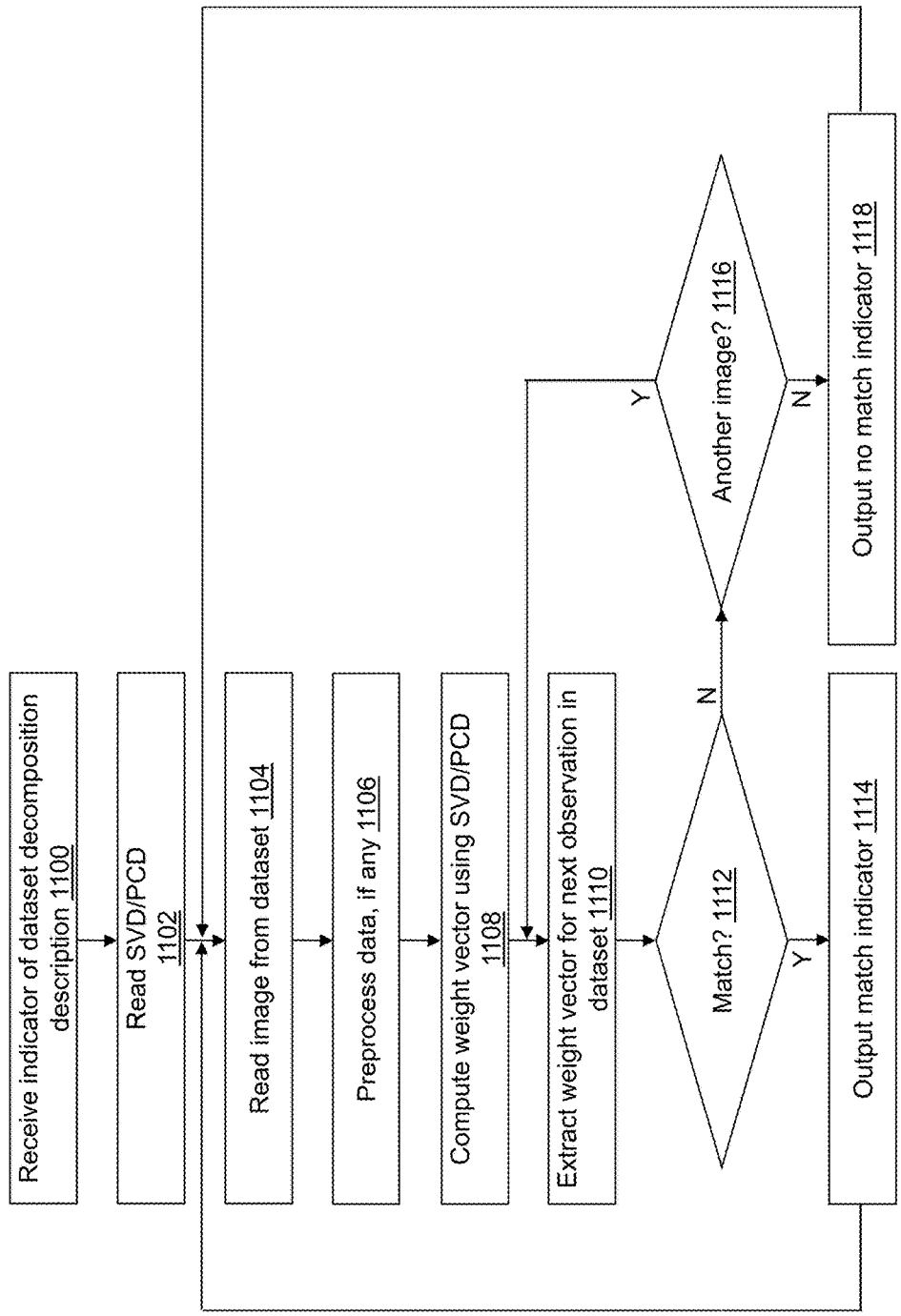
FIG. 11 depicts a flow diagram illustrating examples of operations performed by the classification device of FIG. 101 in accordance with an illustrative embodiment.

Referring to FIG. 11, example operations of classification application 1022 for the recognition mode are described. Additional, fewer, or different operations may be performed depending on the embodiment of classification application 1022. The order of presentation of the operations of FIG. 11 is not intended to be limiting. Although some of the operational flows are presented in sequence, the various operations may be performed in various repetitions, concurrently (in parallel, for example, using threads and/or a distributed computing system), and/or in other orders than those that are illustrated.

In an operation 1100, an eighth indicator may be received that indicates dataset decomposition description 126. For example, the eighth indicator indicates a location and a name of dataset decomposition description 126. As an example, the eighth indicator may be received by classification application 1022 after selection from a user interface window or after entry by a user into a user interface window. In an alternative embodiment, dataset decomposition description 126 may not be selectable. For example, a most recently created dataset may be used automatically.

In an operation 1102, a decomposition description is read from dataset decomposition description 126. For example, $\tilde{V}^T$ the approximation of the orthonormal matrix of right singular vectors is read from dataset decomposition description 126.

In an operation 1104, an observation vector u is read from second dataset 1024.

In an operation 1106, the observation vector u is pre-processed if any pre-processing is performed. For illustration, the pre-processing previously performed in operation 206 for dataset 124 is performed on observation vector u.

In an operation 1108, a weight vector w is computed for the observation vector u using the read decomposition description that forms the SVD/PCD. For example, a weight vector $w = \tilde{V}^T(u-m)$ is computed where m is a mean observation vector computed from dataset 124. m may be stored in and read from dataset decomposition description 126.

In an operation 1110, the weight vector $w_i = \tilde{V}^T(u-m)$ corresponding to image i in second dataset 1024 is extracted from dataset 124.

In an operation 1112, a determination is made concerning whether or not the observation vector u is a match to image i. When the observation vector u is a match, processing continues in an operation 1114. When the observation vector u is not a match, processing continues in an operation 1116. For example, a Euclidean distance is computed between weight vector w and a weight vector for image i as $d_i = \|w-$ $w_i\|$. Based on a value of the distance $d_i$, the observation vector u may be determined to be a match to the selected next observation vector.

In operation 1114, a match indicator is output, for example, by storing and indication of the match to second non-transitory computer-readable medium 1008, presenting an indication of the match on second display 1016, printing an indication of the match on second printer 1020, sending a message to another computing device indicating the match using second communication interface 1006, etc., and processing continues in operation 1104 to continue to process images in second dataset 1024.

In operation 1116, a determination is made concerning whether or not dataset 124 includes another image. When dataset 124 includes another image, processing continues in operation 1110. When dataset 124 does not include another image, processing continues in an operation 1118.

In operation 1118, a no match indicator is output, for example, by storing and indication of no match to second non-transitory computer-readable medium 1008, presenting an indication of no match on second display 1016, printing an indication of no match on second printer 1020, sending a message to another computing device indicating no match using second communication interface 1006, etc., and processing continues in operation 1104 to continue to process images in second dataset 1024.

Again, there are applications for decomposition application 122 and the resulting dataset decomposition description 126 in areas such as process control and equipment health monitoring, image processing and classification, data segmentation, etc.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, using "and" or "or" in the detailed description is intended to include "and/or" unless specifically indicated otherwise.

The foregoing description of illustrative embodiments of the disclosed subject matter has been presented for purposes of illustration and of description. It is not intended to be exhaustive or to limit the disclosed subject matter to the precise form disclosed, and modifications and variations are possible in light of the above teachings or may be acquired from practice of the disclosed subject matter. The embodiments were chosen and described in order to explain the principles of the disclosed subject matter and as practical applications of the disclosed subject matter to enable one skilled in the art to utilize the disclosed subject matter in various embodiments and with various modifications as suited to the particular use contemplated.

What is claimed is:

1. A non-transitory computer-readable medium having stored thereon computer-readable instructions that when executed by a computing device cause the computing device to:

read a dataset that includes a plurality of observation vectors, wherein each observation vector includes a plurality of variable values;

compute an approximate decomposition of the read dataset using either a principal components decomposition algorithm or a singular value decomposition algorithm;

compute a lower bound of a largest singular value for the computed approximate decomposition using a first linear approximation to a function of a singular value ratio;

compute a first set of coefficients for a second linear approximation to an error function computed for the function of the singular value ratio using the computed approximate decomposition;

compute a second set of coefficients for a third linear approximation using the computed first set of coefficients;

compute an upper bound of the largest singular value for the computed approximate decomposition using the computed second set of coefficients; and output the computed upper bound of the largest singular value and the computed lower bound of the largest singular value.

2. The non-transitory computer-readable medium of claim 1, wherein the computed approximate decomposition includes a score matrix $\tilde{T}$ and a singular value j is computed using $\tilde{\sigma}_j = \|\tilde{t}_j\|_2$, $j = 1, \ldots, k$, where k is a predefined rank value, $\tilde{\sigma}_j$ is singular value j, $\tilde{t}_j$ is a jth column of the score matrix $\tilde{T}$, and $\|*\|_2$ is a vector 2 norm of *.

3. The non-transitory computer-readable medium of claim 2, wherein a first intermediate value $Z_1$ is computed using $Z_1 = \sum_{j=1}^{k} \tilde{\sigma}_j$, where $Z_1$ is the first intermediate value.

4. The non-transitory computer-readable medium of claim 3, wherein a second intermediate value is computed using $Z_2 = \|\tilde{T}\|_F^2$, where $Z_2$ is the second intermediate value, and $\|*\|_F$ is a Frobenius matrix norm of *.

5. The non-transitory computer-readable medium of claim 4, wherein a third intermediate value is computed using $Z_3 = \|X^T \tilde{T}\|_F^2$, where $Z_3$ is the third intermediate value, and X is the plurality of observation vectors.

6. The non-transitory computer-readable medium of claim 5, wherein the lower bound is computed using $$\sigma_{lower} = e^{\left(0.1\left[\log(Z_2) - \log\left(\sum_{j=1}^{k}\sqrt{\tilde{\beta}_j}\right)\right] + 0.2\left[\log(Z_3) - \log\left(\sum_{j=1}^{k} \tilde{\beta}_j\right)\right]\right)},$$

where $\sigma_{lower}$ is the lower bound and $$\tilde{\beta}_j = \frac{\tilde{\sigma}_j^4}{\tilde{\sigma}_1^4}$$

is the singular value ratio.

7. The non-transitory computer-readable medium of claim 1, wherein the first set of coefficients are computed by fitting a line to the function of the singular value ratio, wherein the first set of coefficients include a slope and an intercept of the fit line.

8. The non-transitory computer-readable medium of claim 7, wherein the singular value ratio is computed using $$\tilde{\beta}_j = \frac{\tilde{\sigma}_j^4}{\tilde{\sigma}_1^4},$$

where $\tilde{\sigma}_j = \|\tilde{t}_j\|_2$, $j = 1, \ldots, k$, where k is a predefined rank value, $\tilde{\sigma}_j$ is a singular value, $\tilde{t}_j$ is a jth column of a score matrix $\tilde{T}$, and $\|*\|_2$ is a vector 2 norm of *, wherein the computed approximate decomposition includes the score matrix $\tilde{T}$.

9. The non-transitory computer-readable medium of claim 1, wherein the first set of coefficients are computed as $\rho_1=0.25q_1^{-3/4}$, $\gamma_1=0.75q_1^{1/4}$, $\rho_2=0.5q_2^{-1/2}$, and $\gamma_2=0.5q_2^{1/2}$, where the first set of coefficients include $\rho_1$, $\gamma_1$, $\rho_2$, and $\gamma_2$, and $q_1$ and $q_2$ are predefined values where $0 \leq q_1 \leq 1$ and $0 \leq q_2 \leq 1$.

10. The non-transitory computer-readable medium of claim 1, wherein computing the lower bound comprises:
    compute a third set of coefficients for the first linear approximation using the computed approximate decomposition; and
    compute a fourth set of coefficients for a fourth linear approximation using the computed third set of coefficients;
    wherein the lower bound is computed using the computed fourth set of coefficients.

11. The non-transitory computer-readable medium of claim 1, wherein the computer-readable instructions further cause the computing device to:
    compute a largest singular value from the computed approximate decomposition; and
    determine whether or not the computed largest singular value falls between the computed upper bound and the computed lower bound;
    wherein the computed upper bound and the computed lower bound are output when the computed largest singular value falls between the computed upper bound and the computed lower bound.

12. The non-transitory computer-readable medium of claim 1, wherein the computer-readable instructions further cause the computing device to:
    present the computed approximate decomposition, the computed upper bound, and the computed lower bound in a display; and
    receive an acceptance indicator;
    wherein the computed upper bound and the computed lower bound are output when the acceptance indicator is received.

13. The non-transitory computer-readable medium of claim 1, wherein the computer-readable instructions further cause the computing device to:
    present the computed approximate decomposition, the computed upper bound, and the computed lower bound in a display; and
    receive a non-acceptance indicator;
    wherein the approximate decomposition, the upper bound, and the lower bound are computed for a next iteration when the non-acceptance indicator is received before the computed upper bound and the computed lower bound are output.

14. A computing device comprising:
    a processor; and
    a non-transitory computer-readable medium operably coupled to the processor, the computer-readable medium having computer-readable instructions stored thereon that, when executed by the processor, cause the computing device to
        read a dataset that includes a plurality of observation vectors, wherein each observation vector includes a plurality of variable values;
        compute an approximate decomposition of the read dataset using either a principal components decomposition algorithm or a singular value decomposition algorithm;
        compute a lower bound of a largest singular value for the computed approximate decomposition using a first linear approximation to a function of a singular value ratio;
        compute a first set of coefficients for a second linear approximation to an error function computed for the function of the singular value ratio using the computed approximate decomposition;
        compute a second set of coefficients for a third linear approximation using the computed first set of coefficients;
        compute an upper bound of the largest singular value for the computed approximate decomposition using the computed second set of coefficients; and
        output the computed upper bound of the largest singular value and the computed lower bound of the largest singular value.

15. The computing device of claim 14, wherein the first set of coefficients are computed by fitting a line to the function of the singular value ratio, wherein the first set of coefficients include a slope and an intercept of the fit line.

16. The computing device of claim 15, wherein the singular value ratio is computed using $$\tilde{\beta}_j = \frac{\tilde{\sigma}_j^4}{\tilde{\sigma}_1^4},$$

where $\tilde{\sigma}_j = \|\tilde{t}_j\|_2$, $j=1, \ldots, k$, where k is a predefined rank value, $\tilde{\sigma}_j$ is a singular value, $\tilde{t}_j$ is a jth column of a score matrix $\tilde{T}$, and $\|*\|_2$ is a vector 2 norm of *, wherein the computed approximate decomposition includes the score matrix $\tilde{T}$.

17. The computing device of claim 14, wherein the first set of coefficients are computed as $\rho_1=0.25q_1^{-3/4}$, $\gamma_1=0.75q_1^{1/4}$, $\rho_2=0.5q_2^{-1/2}$, and $\gamma_2=0.5q_2^{1/2}$, where the first set of coefficients include $\rho_1$, $\gamma_1$, $\rho_2$, and $\gamma_2$, and $q_1$ and $q_2$ are predefined values where $0 \leq q_1 \leq 1$ and $0 \leq q_2 \leq 1$.

18. The computing device of claim 14, wherein computing the lower bound comprises:
    compute a third set of coefficients for the first linear approximation using the computed approximate decomposition; and
    compute a fourth set of coefficients for a fourth linear approximation using the computed third set of coefficients;
    wherein the lower bound is computed using the computed fourth set of coefficients.

19. The computing device of claim 14, wherein the computer-readable instructions further cause the computing device to:
    compute a largest singular value from the computed approximate decomposition; and
    determine whether or not the computed largest singular value falls between the computed upper bound and the computed lower bound;
    wherein the computed upper bound and the computed lower bound are output when the computed largest singular value falls between the computed upper bound and the computed lower bound.

20. The computing device of claim 14, wherein the computer-readable instructions further cause the computing device to:
    present the computed approximate decomposition, the computed upper bound, and the computed lower bound in a display; and receive an acceptance indicator;
wherein the computed upper bound and the computed lower bound are output when the acceptance indicator is received.

21. The computing device of claim 14, wherein the computer-readable instructions further cause the computing device to:
present the computed approximate decomposition, the computed upper bound, and the computed lower bound in a display; and
receive a non-acceptance indicator;
wherein the approximate decomposition, the upper bound, and the lower bound are computed for a next iteration when the non-acceptance indicator is received before the computed upper bound and the computed lower bound are output.

22. A method of determining upper and lower bounds of a largest singular value for an approximate decomposition of a dataset, the method comprising:
reading, by a computing device, a dataset that includes a plurality of observation vectors, wherein each observation vector includes a plurality of variable values;
computing, by the computing device, an approximate decomposition of the read dataset using either a principal components decomposition algorithm or a singular value decomposition algorithm;
computing, by the computing device, a lower bound of a largest singular value for the computed approximate decomposition using a first linear approximation to a function of a singular value ratio;
computing, by the computing device, a first set of coefficients for a second linear approximation to an error function computed for the function of the singular value ratio using the computed approximate decomposition;
computing, by the computing device, a second set of coefficients for a third linear approximation using the computed first set of coefficients;
computing, by the computing device, an upper bound of the largest singular value for the computed approximate decomposition using the computed second set of coefficients; and
outputting, by the computing device, the computed upper bound of the largest singular value and the computed lower bound of the largest singular value.

23. The method of claim 22, wherein the first set of coefficients are computed by fitting a line to the function of the singular value ratio, wherein the first set of coefficients include a slope and an intercept of the fit line.

24. The method of claim 23, wherein the singular value ratio is computed using $$\tilde{\beta}_j = \frac{\tilde{\sigma}_j^4}{\tilde{\sigma}_1^4},$$

where $\tilde{\sigma}_j = \|\tilde{t}_j\|_2$, $j=1, \ldots, k$, where k is a predefined rank value, $\tilde{\sigma}_j$ is a singular value, $\tilde{t}_j$ is a jth column of a score matrix $\tilde{T}$, and $\|*\|_2$ is a vector 2 norm of *, wherein the computed approximate decomposition includes the score matrix $\tilde{T}$.

25. The method of claim 22, wherein the first set of coefficients are computed as $\rho_1=0.25q_1^{-3/4}$, $\gamma_1=0.75q_1^{1/4}$, $\rho_2=0.5q_2^{-1/2}$, and $\gamma_2=0.5q_2^{1/2}$, where the first set of coefficients include $\rho_i, \gamma_1, \rho_2,$ and $\gamma_2$, and $q_1$ and $q_2$ are predefined values where $0 \leq q_1 \leq 1$ and $0 \leq q_2 \leq 1$.

26. The method of claim 22, wherein computing the lower bound comprises:
computing, by the computing device, a third set of coefficients for the first linear approximation using the computed approximate decomposition; and
computing, by the computing device, a fourth set of coefficients for a fourth linear approximation using the computed third set of coefficients;
wherein the lower bound is computed using the computed fourth set of coefficients.

27. The method of claim 22, further comprising:
computing, by the computing device, a largest singular value from the computed approximate decomposition; and
determining, by the computing device, whether or not the computed largest singular value falls between the computed upper bound and the computed lower bound;
wherein the computed upper bound and the computed lower bound are output when the computed largest singular value falls between the computed upper bound and the computed lower bound.

28. The method of claim 22, further comprising:
presenting, by the computing device, the computed approximate decomposition, the computed upper bound, and the computed lower bound in a display; and
receiving an acceptance indicator;
wherein the computed upper bound and the computed lower bound are output when the acceptance indicator is received.

29. The method of claim 22, further comprising:
presenting, by the computing device, the computed approximate decomposition, the computed upper bound, and the computed lower bound in a display; and
receiving a non-acceptance indicator;
wherein the approximate decomposition, the upper bound, and the lower bound are computed for a next iteration when the non-acceptance indicator is received before the computed upper bound and the computed lower bound are output.

30. The method of claim 22, wherein the computed approximate decomposition includes a score matrix $\tilde{T}$ and a singular value j is computed using $\tilde{\sigma}_j = \|\tilde{t}_j\|_2$, $j=1, \ldots, k$, where k is a predefined rank value, $\tilde{\sigma}_j$ is singular value j, $\tilde{t}_j$ is a jth column of the score matrix $\tilde{T}$, and $\|*\|_2$ is a vector 2 norm of *.

* * * * *

UNITED STATES PATENT AND TRADEMARK OFFICE
CERTIFICATE OF CORRECTION

PATENT NO. : 9,697,177 B1
APPLICATION NO. : 15/390164
DATED : July 4, 2017
INVENTOR(S) : Douglas Allan Cairns et al.

It is certified that error appears in the above-identified patent and that said Letters Patent is hereby corrected as shown below:

In the Specification

Column 3, Line 4:
Delete "vectors, E is a diagonal matrix" and replace it with --vectors, $\Sigma$ is a diagonal matrix--

Column 4, Line 22:
Delete "function of and 2)" and replace it with --function of $\beta$ and 2)--

Column 12, Line 66:
Delete "loading matrix $\dot{W}$" and replace it with --loading matrix $\tilde{W}$--

Column 14, Line 39:
Delete "errors $\Delta_{i1}$ and $\Delta_2$ are positive" and replace it with --errors $\Delta_{i1}$ and $\Delta_{i2}$ are positive--

Column 15, Line 25-45:
Delete "where $$x_1 = \frac{k}{3}, \quad x_\ell = k, \ell$$

is a number of subintervals between $$\frac{k}{3}$$

and $k$, and $$x_j = x_1 + j\left(\frac{2k}{3\ell}\right)$$

to solve for $\delta_1$, $\lambda_1$, $\delta_2$, and $\lambda_2$, the second set of coefficients for the second linear Signed and Sealed this
Nineteenth Day of September, 2017

Joseph Matal
*Performing the Functions and Duties of the*
*Under Secretary of Commerce for Intellectual Property and*
*Director of the United States Patent and Trademark Office* approximation" and replace it with --where $x_1 = \frac{k}{3}$, $x_\ell = k$, $\ell$ is a number of subintervals between $\frac{k}{3}$ and $k$, and $x_j = x_1 + j\left(\frac{2k}{3\ell}\right)$ to solve for $\delta_1$, $\lambda_1$, $\delta_2$, and $\lambda_2$, the second set of coefficients for the second linear approximation--

Column 22, Line 6:
Delete "A third curve 924 represents $\sigma_{1upper}/\sigma_{1true}$" and replace it with --A third curve 924 represents $\sigma_{\sim 1upper}/\sigma_{1true}$--

In the Claims

Column 28, Line 64:
Delete "value, d is a singular value" and replace it with --value, $\tilde{\sigma}_j$ is a singular value--